United States Patent
Andersson et al.

(10) Patent No.: US 12,231,034 B2
(45) Date of Patent: Feb. 18, 2025

(54) DRIVE CIRCUIT WITH ENERGY RECOVERY FUNCTION AND SWITCH MODE POWER SUPPLY

(71) Applicant: HUAWEI TECHNOLOGIES CO., LTD., Guangdong (CN)

(72) Inventors: Mattias Andersson, Kista (SE); Grover Victor Torrico-Bascopé, Kista (SE); Shengyong Dai, Dongguan (CN); Xiao Zhang, Xi'an (CN); Qingzu Hong, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 62 days.

(21) Appl. No.: 18/145,179

(22) Filed: Dec. 22, 2022

(65) Prior Publication Data
US 2023/0131154 A1 Apr. 27, 2023

Related U.S. Application Data

(63) Continuation of application No. PCT/CN2021/101795, filed on Jun. 23, 2021.

(30) Foreign Application Priority Data

Jun. 23, 2020 (CN) .......................... 202010595162.X

(51) Int. Cl.
*H02M 1/088* (2006.01)
*H02M 3/07* (2006.01)

(52) U.S. Cl.
CPC .............. *H02M 1/088* (2013.01); *H02M 3/07* (2013.01)

(58) Field of Classification Search
CPC .. H02M 1/088; H02M 1/0048; H02M 1/0054; H02M 1/08; H02M 3/07;
(Continued)

(56) References Cited

U.S. PATENT DOCUMENTS

| 5,010,261 A | 4/1991 | Steigerwald |
| 6,686,729 B1 * | 2/2004 | Kawamura ...... H03K 17/04163 323/282 |

(Continued)

FOREIGN PATENT DOCUMENTS

| CN | 106887949 A | 6/2017 |
| CN | 109698612 A | 4/2019 |

(Continued)

OTHER PUBLICATIONS

Extended European Search Report for EP Application No. 21830258 dated Oct. 27, 2023, 11 pages.

(Continued)

*Primary Examiner* — Sibin Chen

(57) ABSTRACT

The technology of this application relates to a drive circuit with an energy recovery function, including a control circuit, an energy recovery drive circuit, a switch circuit, and a direct current power supply. The control circuit is configured to control an energy storage capacitor in the energy recovery drive circuit to charge a junction capacitor of the switch circuit at a first moment, and enable the direct current power supply to charge the junction capacitor of the switch circuit through the energy recovery drive circuit at a second moment, so that the switch circuit is switched on. The control circuit is further configured to control the junction capacitor of the switch circuit to charge the energy storage capacitor in the energy recovery drive circuit at a third moment, and enable the junction capacitor of the switch circuit to discharge to a ground through the energy recovery drive circuit at a fourth moment, so that the switch circuit is switched off.

16 Claims, 11 Drawing Sheets

(58) Field of Classification Search
CPC ... H03K 2217/0036; H03K 2217/0081; H03K 17/6877
See application file for complete search history.

(56) References Cited

U.S. PATENT DOCUMENTS

| | | | |
|---|---|---|---|
| 8,547,143 B2 | 10/2013 | Swamy et al. | |
| 10,009,022 B2* | 6/2018 | Ramadass | H03K 17/687 |
| 2008/0117131 A1* | 5/2008 | Choi | G09G 3/2965 |
| | | | 345/60 |
| 2008/0150438 A1* | 6/2008 | Song | G09G 3/2965 |
| | | | 315/169.4 |
| 2013/0334987 A1* | 12/2013 | Garg | H10N 30/802 |
| | | | 318/116 |
| 2018/0004347 A1* | 1/2018 | Guedon | G06F 3/044 |
| 2018/0331613 A1 | 11/2018 | Kondo | |

FOREIGN PATENT DOCUMENTS

| | | |
|---|---|---|
| CN | 111884491 A | 11/2020 |
| WO | 2017119090 A1 | 7/2017 |

OTHER PUBLICATIONS

PCT International Search Report for Application No. PCT/CN2021/101795 dated Jun. 23, 2021, 10 pages.

* cited by examiner

DRIVE CIRCUIT WITH ENERGY RECOVERY FUNCTION AND SWITCH MODE POWER SUPPLY

CROSS-REFERENCE TO RELATED APPLICATION(S)

This application is a continuation of International Application No. PCT/CN2021/101795, filed on Jun. 23, 2021, claims priority to Chinese Patent Application No. 202010595162.X, filed on Jun. 23, 2020. The disclosures of the aforementioned applications are hereby incorporated by reference in their entireties.

TECHNICAL FIELD

This application relates to the circuit field, and in particular, to a drive circuit with an energy recovery function and a switch mode power supply.

BACKGROUND

With development of power supplies and power modules towards high density, high efficiency, and high frequencies, in particular, in a high-power application scenario, a plurality of power tubes need to be used in parallel.

FIG. 1 is a schematic diagram of a structure of a conventional drive circuit in which a drive chip is used. As shown in FIG. 1, a conventional totem pole push-pull circuit based on a metal-oxide-semiconductor field-effect transistor (MOSFET) or a bipolar junction transistor (BJT) is used in the drive chip, and a junction capacitor of a power tube is charged or discharged by using a drive resistor $R_g$. During charging or discharging, all drive energy is consumed by the drive resistor $R_g$ and the totem pole push-pull circuit in the drive chip. As a quantity of parallel power tubes increases, a required driving loss becomes larger, which reduces efficiency of an entire system. Especially under light load, a proportion of driving loss in system loss sharply increases, seriously affecting system efficiency under the light load.

Therefore, a conventional technology further proposes a specific drive circuit with energy recovery. As shown in a diagram a and a diagram b in FIG. 2, a resonant inductor $L_r$ and a free-run clamping diode D1 or D2 or a free-run MOS transistor are added after the conventional totem pole push-pull circuit. During switching-off of a power tube (S2 is switched on), resonance occurs between a junction capacitor of the power tube Q and the resonant inductor, and energy of the junction capacitor of the power tube Q is transferred to the resonant inductor, so that drive energy of the junction capacitor of the power tube Q is recovered. During next switching-on ($S_1$ is switched on), energy stored in the resonant inductor is transferred to the junction capacitor of the power tube Q.

However, because the resonant inductor is added to the circuit shown in the diagram a and the diagram b in FIG. 2, a volume of the drive circuit becomes quite large, and control of the drive circuit also becomes more complex than that of the conventional drive circuit.

SUMMARY

Embodiments of this application provide a drive circuit with an energy recovery function and a switch mode power supply. With embodiments of the present technology, energy can be fully utilized. In addition, the drive circuit has a small volume and simple control logic.

According to a first aspect, an embodiment of this application provides a drive circuit with an energy recovery function, including a control circuit, an energy recovery drive circuit, a switch circuit, and a direct current power supply. The control circuit is connected to the energy recovery drive circuit, the energy recovery drive circuit is connected to the switch circuit, and the direct current power supply is connected to the energy recovery drive circuit;

the control circuit is configured to control the energy recovery drive circuit to enable an energy storage capacitor in the energy recovery drive circuit to charge a junction capacitor of the switch circuit at a first moment, and enable the direct current power supply to charge the junction capacitor of the switch circuit through the energy recovery drive circuit at a second moment, so that the switch circuit is switched on; and the control circuit is further configured to control the energy recovery drive circuit to enable the junction capacitor of the switch circuit to charge the energy storage capacitor in the energy recovery drive circuit at a third moment, and enable the junction capacitor of the switch circuit to discharge to a ground through the energy recovery drive circuit at a fourth moment, so that the switch circuit is switched off.

By controlling an operating status of the energy recovery drive circuit, a part of drive energy stored on the junction capacitor of the switch circuit is transferred to the energy storage capacitor in the energy recovery drive circuit, to recover and reuse the drive energy and prevent all drive energy from being consumed on a drive resistor. This greatly reduces driving loss, so that overall system efficiency is higher, and control logic is simple.

In a possible embodiment, the energy recovery drive circuit includes a push-pull drive circuit and an energy recovery circuit, the control circuit is connected to both the push-pull drive circuit and the energy recovery circuit, both the push-pull drive circuit and the energy recovery circuit are connected to the switch circuit, and the direct current power supply is connected to the push-pull drive circuit; and that the control circuit is configured to control the energy recovery drive circuit to enable an energy storage capacitor in the energy recovery drive circuit to charge a junction capacitor of the switch circuit at a first moment, and enable the direct current power supply to charge the junction capacitor of the switch circuit through the energy recovery drive circuit at a second moment includes:

the control circuit is configured to control the energy recovery circuit to enable the energy storage capacitor in the energy recovery circuit to charge the junction capacitor of the switch circuit at the first moment, and control the push-pull drive circuit to enable the direct current power supply to charge the junction capacitor of the switch circuit through the push-pull drive circuit at the second moment; and that the control circuit is further configured to control the energy recovery drive circuit to enable the junction capacitor of the switch circuit to charge the energy storage capacitor in the energy recovery drive circuit at a third moment, and enable the junction capacitor of the switch circuit to discharge to a ground through the energy recovery drive circuit at a fourth moment includes:

the control circuit is configured to control the energy recovery circuit to enable the junction capacitor of the switch circuit to charge the energy storage capacitor in the energy recovery circuit at the third moment, and control the push-pull drive circuit to enable the junction capacitor of the switch circuit to discharge to the ground through the push-pull drive circuit at the fourth moment.

Optionally, the switch circuit includes a resistor R4, a MOS transistor M0, a capacitor Cdg, and a capacitor Cgs. A first terminal of the resistor R4 is connected to a gate of the MOS transistor M0, two terminals of the capacitor Cdg are respectively connected to a drain and the gate of the MOS transistor M0, two terminals of the capacitor Cgs are respectively connected to a source and the gate of the MOS transistor, and the source of the MOS transistor M0 is connected to a second terminal of the resistor R4; and that the switch circuit is switched on and switched off specifically means that the drain and the source of the MOS transistor M0 are connected and disconnected, and the junction capacitor of the switch circuit includes the capacitor Cds and the capacitor Cgs.

The MOS transistor M0 is an NPN MOS transistor.

Optionally, the push-pull drive circuit includes an NPN triode Q1, a PNP triode Q4, a capacitor C3, and a resistor R2; and an emitter of the triode Q4 is connected to an emitter of the triode Q1, a base of the triode Q4 is connected to a base of the triode Q1, a second terminal of the resistor R2 is connected to the base of the triode Q4, a first terminal of the resistor R2 is connected between the emitter of the triode Q4 and the emitter of the triode Q1 through a resistor R5, a first terminal of the capacitor C3 is connected between the emitter of the triode Q4 and the emitter of the triode Q1, a second terminal of the capacitor C3 is connected between the base of the triode Q4 and the base of the triode Q1, and a collector of the triode Q1 is grounded.

Optionally, the energy recovery circuit includes an NPN triode Q2, a PNP triode Q3, a clamping diode D2, a clamping diode D3, a capacitor C2, and a resistor R1, and the capacitor C2 is the energy storage capacitor in the energy recovery drive circuit; and an emitter of the triode Q2 is connected to an emitter of the triode Q3, both a base of the triode Q2 and a base of the triode Q3 are connected to a second terminal of the resistor R1, a collector of the triode Q2 is connected to a negative electrode of the diode D2, a collector of the triode Q3 is connected to a positive electrode of the diode D3, both a negative electrode of the diode D3 and a positive electrode of the diode D2 are connected to a first terminal of the capacitor C2, and a second terminal of the capacitor C2 is grounded.

Optionally, the push-pull drive circuit includes an NPN triode Q1, a PNP triode Q4, a capacitor C3, and a capacitor C4; and an emitter of the triode Q4 is connected to an emitter of the triode Q1, a base of the triode Q4 is connected to a base of the triode Q1, a second terminal of the capacitor C4 is connected to the base of the triode Q4, a first terminal of the capacitor C4 is connected between the emitter of the triode Q4 and the emitter of the triode Q1 through a resistor R5, a first terminal of the capacitor C3 is connected between the emitter of the triode Q4 and the emitter of the triode Q1, a second terminal of the capacitor C3 is connected between the base of the triode Q4 and the base of the triode Q1, and a collector of the triode Q1 is grounded.

Optionally, the energy recovery circuit includes an NPN triode Q2, a PNP triode Q3, a clamping diode D2, a clamping diode D3, a capacitor C2, a capacitor C5, and a resistor R1, and the capacitor C2 is the energy storage capacitor in the energy recovery drive circuit; and an emitter of the triode Q2 is connected to an emitter of the triode Q3, both a base of the triode Q2 and a base of the triode Q3 are connected to a second terminal of the resistor R1 and a second terminal of the capacitor C5, a first terminal of the resistor R1 is connected to a first terminal of the capacitor C5, a collector of the triode Q2 is connected to a negative electrode of the diode D2, a collector of the triode Q3 is connected to a positive electrode of the diode D3, both a negative electrode of the diode D3 and a positive electrode of the diode D2 are connected to a first terminal of the capacitor C2, and a second terminal of the capacitor C2 is grounded.

Optionally, a parameter of the diode D2 is the same as that of the diode D3.

Optionally, a parameter of the triode Q1 is the same as that of the triode Q3, and a parameter of the triode Q2 is the same as that of the triode Q4.

In a possible embodiment, the switch circuit includes a capacitor Cdg, a capacitor Cgs, and an equivalent drive pull-down resistor R4, and that both the push-pull drive circuit and the energy recovery circuit are connected to the switch circuit specifically includes:

the gate of the MOS transistor is connected between the emitter of the triode Q4 and the emitter of the triode Q1, and the source of the MOS transistor is connected to the collector of the triode Q1; and the gate of the MOS transistor is connected between the emitter of the triode Q2 and the emitter of the triode Q3, and the source of the MOS transistor is connected to the second terminal of the capacitor C2; and that the direct current power supply is connected to the push-pull drive circuit specifically includes: a positive electrode of the direct current power supply is connected to a collector of the triode Q4, and a negative electrode of the direct current power supply is grounded.

In a possible embodiment, the control circuit includes a first drive signal generator; and that the control circuit is connected to both the push-pull drive circuit and the energy recovery circuit specifically includes:

a positive electrode of the first drive signal generator is connected to the first terminal of the resistor R2 and the first terminal of the resistor R1 through a resistor R3, and a negative electrode of the first drive signal generator is grounded; or a positive electrode of the first drive signal generator is connected to the first terminal of the capacitor C4 and the first terminal of the resistor R1 through a resistor R3, and a negative electrode of the first drive signal generator is grounded.

In a possible embodiment, that the control circuit is configured to control the energy recovery circuit to enable the energy storage capacitor in the energy recovery circuit to charge the junction capacitor of the switch circuit at the first moment specifically includes:

the first drive signal generator outputs a rising edge of a drive signal, and a voltage output by the first drive signal generator is greater than a breakover voltage of the triode Q2 at the first moment, so that the capacitor C2 charges the capacitor Cdg and the capacitor Cgs of the switch circuit through the diode D2 and the triode Q2; and that the control circuit is configured to control the push-pull drive circuit to enable the direct current power supply to charge the junction capacitor of the switch circuit through the push-pull drive circuit at the second moment specifically includes:

the first drive signal generator outputs a rising edge of a drive signal, and charges the capacitor C3, so that a voltage on the capacitor C3 is greater than a breakover voltage of the triode Q4 at the second moment, and the direct current power supply charges the capacitor Cdg and the capacitor Cgs through the triode Q4.

In a possible embodiment, that the control circuit is configured to control the energy recovery circuit to enable the junction capacitor of the switch circuit to charge the energy storage capacitor in the energy recovery circuit at the third moment specifically includes:

the first drive signal generator outputs a falling edge of a drive signal, and a difference between a voltage of the drive signal and a voltage on the capacitor Cdg and the capacitor Cgs of the switch circuit is greater than a breakover voltage of the triode Q3 at the third moment, so that the capacitor Cdg and the capacitor Cgs of the switch circuit charge the capacitor C2 through the triode Q3 and the diode D3; and that the control circuit is configured to control the push-pull drive circuit to enable the junction capacitor of the switch circuit to discharge to the ground through the push-pull drive circuit at the fourth moment specifically includes:

the first drive signal generator outputs a falling edge of a drive signal, and the voltage on the capacitor C3 is made greater than a breakover voltage of the triode Q1 at the fourth moment, so that the capacitor Cdg and the capacitor Cgs of the switch circuit discharge to the ground through the triode Q1.

In a possible embodiment, the control circuit includes a first drive signal generator and a second drive signal generator; and that the control circuit is connected to both the push-pull drive circuit and the energy recovery circuit specifically includes:

a positive electrode of the first drive signal generator is connected to the first terminal of the resistor R1 through a resistor R3, a negative electrode of the first drive signal generator is grounded, a positive electrode of the second drive signal generator is connected to the first terminal of the resistor R2 through a resistor R6, and a negative electrode of the second drive signal generator is grounded; or a positive electrode of the first drive signal generator is connected to the first terminal of the resistor R1 through a resistor R3, a negative electrode of the first drive signal generator is grounded, a positive electrode of the second drive signal generator is connected to the first terminal of the capacitor C4 through a resistor R6, and a negative electrode of the second drive signal generator is grounded.

In a possible embodiment, that the control circuit is configured to control the energy recovery circuit to enable the energy storage capacitor in the energy recovery circuit to charge the junction capacitor of the switch circuit at the first moment specifically includes:

the first drive signal generator outputs a rising edge of a drive signal, and a voltage of the drive signal is greater than a breakover voltage of the triode Q3 at the first moment, so that the capacitor C2 charges the capacitor Cdg and the capacitor Cgs of the switch circuit through the diode D2 and the triode Q2; and that the control circuit is configured to control the push-pull drive circuit to enable the direct current power supply to charge the junction capacitor of the switch circuit through the push-pull drive circuit at the second moment specifically includes:

the second drive signal generator outputs a rising edge of a drive signal, and charges the capacitor C3, so that a voltage on the capacitor C3 is greater than a breakover voltage of the triode Q4 at the second moment, and the direct current power supply charges the capacitor through the triode Q4.

In a possible embodiment, that the control circuit is configured to control the energy recovery circuit to enable the junction capacitor of the switch circuit to charge the energy storage capacitor in the energy recovery circuit at the third moment specifically includes:

the first drive signal generator outputs a falling edge of a drive signal, and a difference between a voltage output by the first drive signal generator and a voltage on the capacitor Cdg and the capacitor Cgs of the switch circuit is greater than a breakover voltage of the triode Q3 at the third moment, so that the capacitor Cdg and the capacitor Cgs of the switch circuit charge the capacitor C2 through the triode Q3 and the diode D3; and that the control circuit is configured to control the push-pull drive circuit to enable the junction capacitor of the switch circuit to discharge to the ground through the push-pull drive circuit at the fourth moment specifically includes:

the second drive signal generator outputs a falling edge of a drive signal, and the voltage on the capacitor C3 is made greater than a breakover voltage of the triode Q1 at the fourth moment, so that the capacitor Cdg and the capacitor Cgs of the switch circuit discharge to the ground through the triode Q1.

The first drive signal generator and the second drive signal generator may be, but are not limited to, drive chips.

According to a second aspect, an embodiment of this application provides a switch mode power supply. The switch mode power supply includes a part or a whole of the drive circuit according to the first aspect.

These aspects or other aspects of this application are clearer and more comprehensible in descriptions of the following embodiments.

BRIEF DESCRIPTION OF DRAWINGS

To describe the technical solutions in embodiments of this application or in the conventional technology more clearly, the following briefly describes the accompanying drawings for describing the embodiments or the conventional technology. It is clear that the accompanying drawings in the following description show some embodiments of this application, and a person of ordinary skill in the art may still derive other drawings from these accompanying drawings without creative efforts.

DESCRIPTION OF EMBODIMENTS

The following describes embodiments of this application with reference to accompanying drawings.

Figure 1:
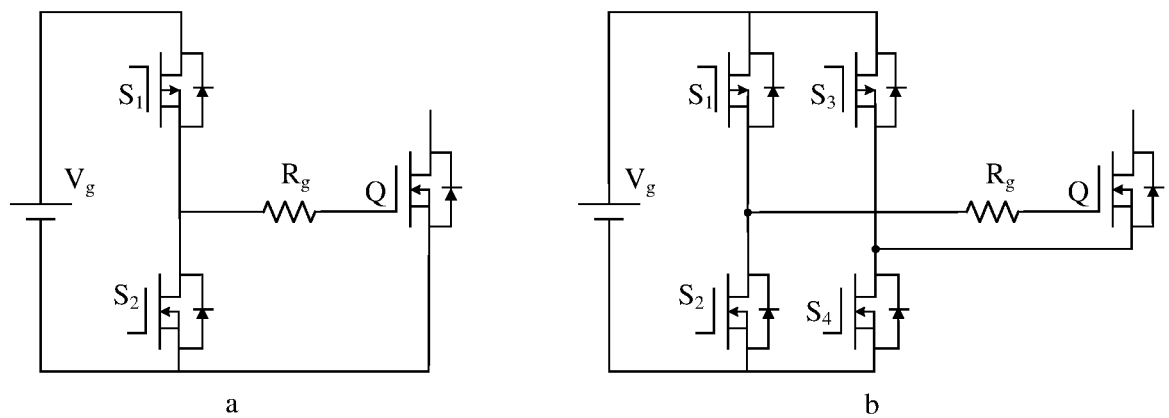
FIG. 1 shows an example drive circuit in a conventional technology.
Figure 2:
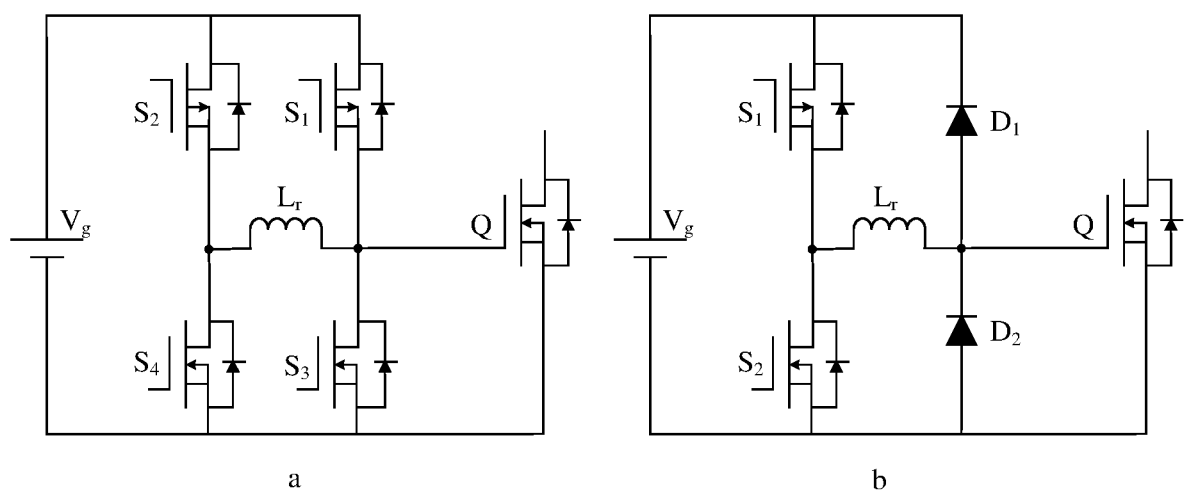
FIG. 2 shows an example circuit with an energy recovery function in a conventional technology.
Figure 3:
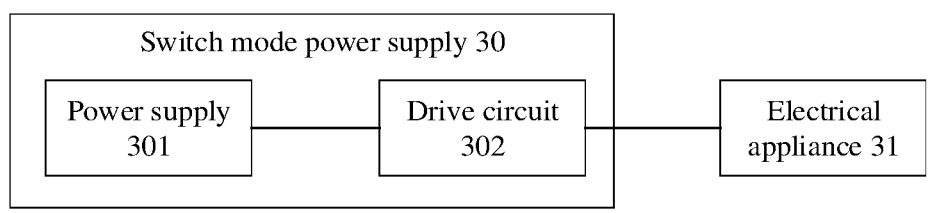
FIG. 3 is an example schematic diagram of an application scenario of a drive circuit with an energy recovery function according to an embodiment of this application.

FIG. 3 is a schematic diagram of an application scenario of a drive circuit with an energy recovery function according to an embodiment of this application. As shown in FIG. 3, the application scenario includes a switch mode power supply 30 and an electrical appliance 31. The switch mode power supply 30 is connected to the electrical appliance 31.

The switch mode power supply 30 includes a power supply 301 and a drive circuit 302. A first port 302a of the drive circuit 302 is connected to the power supply 301, and a second port 302b of the drive circuit 302 is connected to the electrical appliance 31.

The drive circuit 302 controls switching-on and switching-off of a loop between the power supply 301 and the electrical appliance 31, to implement a function of the switch mode power supply.

Herein, it should be noted that the drive circuit with an energy recovery function disclosed in this application may alternatively be applied to another circuit, for example, an inverter.

Figure 4:
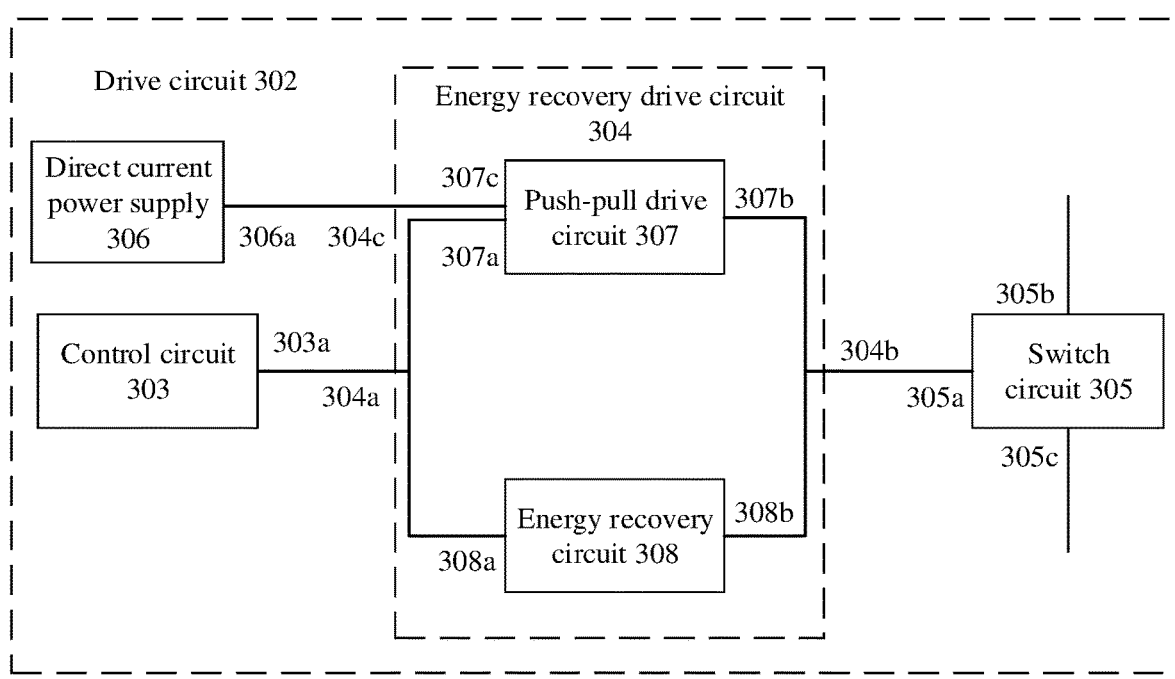
FIG. 4 is an example schematic diagram of a structure of a drive circuit with an energy recovery function according to an embodiment of this application.

FIG. 4 is a schematic diagram of an architecture of a drive circuit with an energy recovery function according to an embodiment of this application. As shown in FIG. 4, the drive circuit 302 includes a control circuit 303, an energy recovery drive circuit 304, a switch circuit 305, and a direct current power supply 306. A control terminal 303a of the control circuit 303 is connected to a first port 304a of the energy recovery drive circuit 304. An output terminal 306a of the direct current power supply 306 is connected to a third port 304c of the energy recovery drive circuit 304. A second port 304b of the energy recovery drive circuit 304 is connected to a first port 305a of the switch circuit 305.

The control circuit 303 is configured to control the energy recovery drive circuit 304 to enable an energy storage capacitor in the energy recovery drive circuit 304 to charge a junction capacitor of the switch circuit 305 at a first moment, and enable the direct current power supply 306 to charge the junction capacitor of the switch circuit 305 through the energy recovery drive circuit 304 at a second moment, so that the switch circuit 305 is switched on, where the first moment is earlier than the second moment.

The control circuit 303 is further configured to control the energy recovery drive circuit 304 to enable the junction capacitor of the switch circuit 305 to charge the energy storage capacitor in the energy recovery drive circuit 304 at a third moment, and enable the junction capacitor of the switch circuit 305 to discharge to a ground through the energy recovery drive circuit 304 at a fourth moment, so that the switch circuit 305 is switched off, where the third moment is earlier than the fourth moment.

That the switch circuit 305 is switched on and switched off specifically means that a second port and a third port of the switch circuit 305 are connected and disconnected.

The second port 305b and the third port 305c of the switch circuit 305 are respectively connected to the electrical appliance 31 and the power supply 301, and the control circuit 303 controls connection and disconnection between the second port 305b and the third port 305c of the switch circuit 305, to switch on and switch off the loop between the power supply 301 and the electrical appliance 31.

Further, the energy recovery drive circuit 304 includes a push-pull drive circuit 307 and an energy recovery circuit 308, the first port 304a of the energy recovery drive circuit 304 includes a first port 307a of the push-pull drive circuit 307 and a first port 308a of the energy recovery circuit 308, and the second port 304b of the energy recovery drive circuit 304 includes a second port 307b of the push-pull drive circuit 307 and a second port 308b of the energy recovery circuit 308.

That a control terminal 303a of the control circuit 303 is connected to a first port 304a of the energy recovery drive circuit 304 specifically includes: The control terminal 303a of the control circuit 303 is connected to both the first port 307a of the push-pull drive circuit 307 and the first port 308a of the energy recovery circuit 308. That a second port 304b of the energy recovery drive circuit 304 is connected to a first port 305a of the switch circuit 305 specifically includes: Both the second port 307b of the push-pull drive circuit 307 and the second port 308b of the energy recovery circuit 308 are connected to the first port 305a of the switch circuit 305. That an output terminal 306a of the direct current power supply 306 is connected to a third port 304c of the energy recovery drive circuit 304 specifically means that the output terminal 306a of the direct current power supply 306 is connected to a third port 307c of the push-pull drive circuit 307.

Specifically, that the control circuit 303 is configured to control the energy recovery drive circuit 304 to enable an energy storage capacitor in the energy recovery drive circuit 304 to charge a junction capacitor of the switch circuit 305 at a first moment, and enable the direct current power supply 306 to charge the junction capacitor of the switch circuit 305 through the energy recovery drive circuit 304 at a second moment specifically includes:

the control circuit 303 controls the energy recovery circuit 308 to enable the energy storage capacitor in the energy recovery circuit 308 to charge the junction capacitor of the switch circuit 305 at the first moment, and controls the push-pull drive circuit 307 to enable the direct current power supply 306 to charge the junction capacitor of the switch circuit 305 through the push-pull drive circuit 307 at the second moment; and that the control circuit 303 is configured to control the energy recovery drive circuit 304 to enable the junction capacitor of the switch circuit 305 to charge the energy storage capacitor in the energy recovery drive circuit 304 at a third moment, and enable the junction capacitor of the switch circuit 305 to discharge to a ground through the energy recovery drive circuit 304 at a fourth moment specifically includes:

the control circuit 303 controls the energy recovery circuit 308 to enable the junction capacitor of the switch circuit to charge the energy storage capacitor in the energy recovery circuit 308 at the third moment, and controls the push-pull drive circuit 307 to enable the junction capacitor of the switch circuit 305 to discharge to the ground through the push-pull drive circuit 307 at the fourth moment.

Figure 5A:
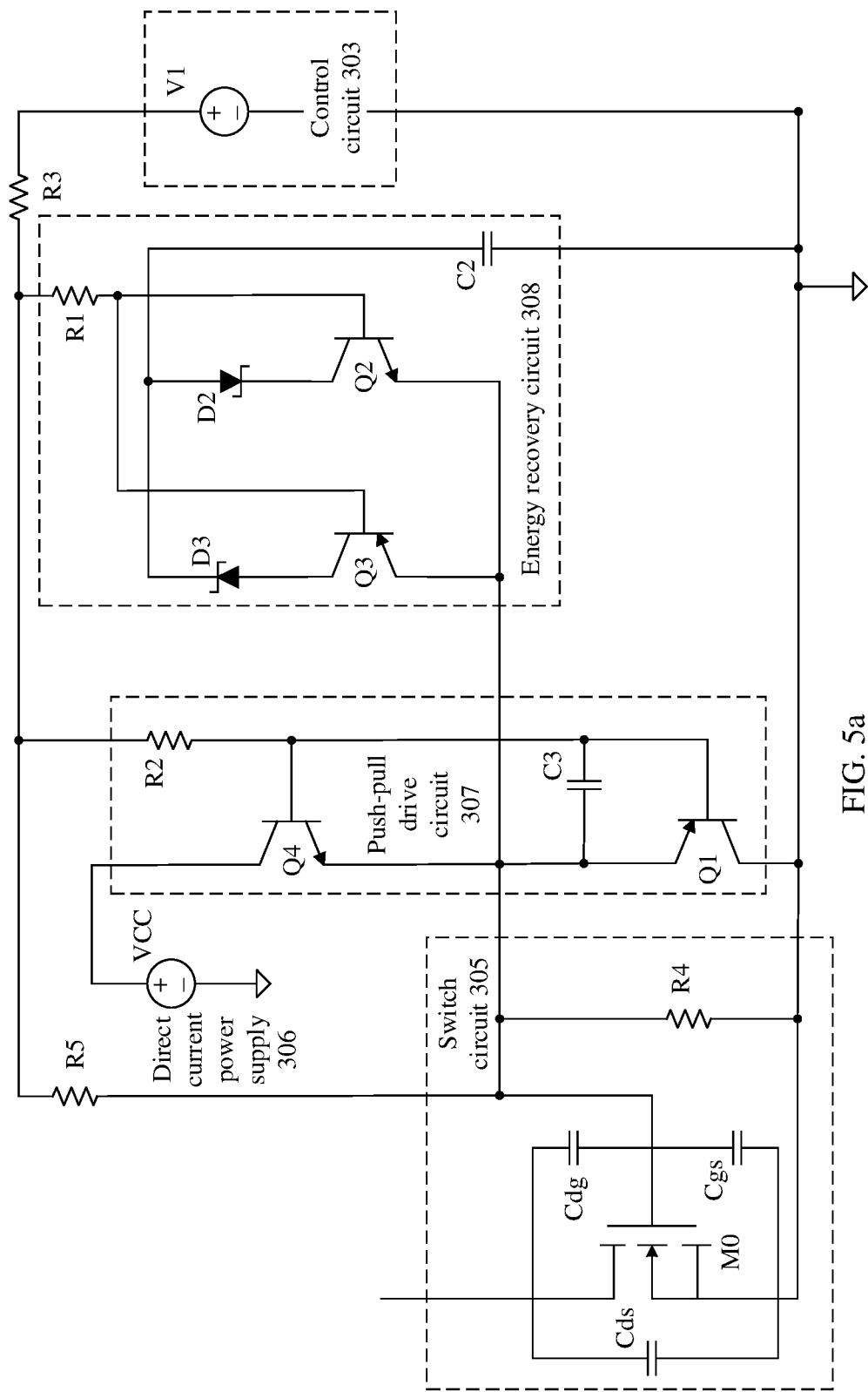
FIG. 5a is an example schematic diagram of a specific structure of a drive circuit with an energy recovery function according to an embodiment of this application.
Figure 6A:
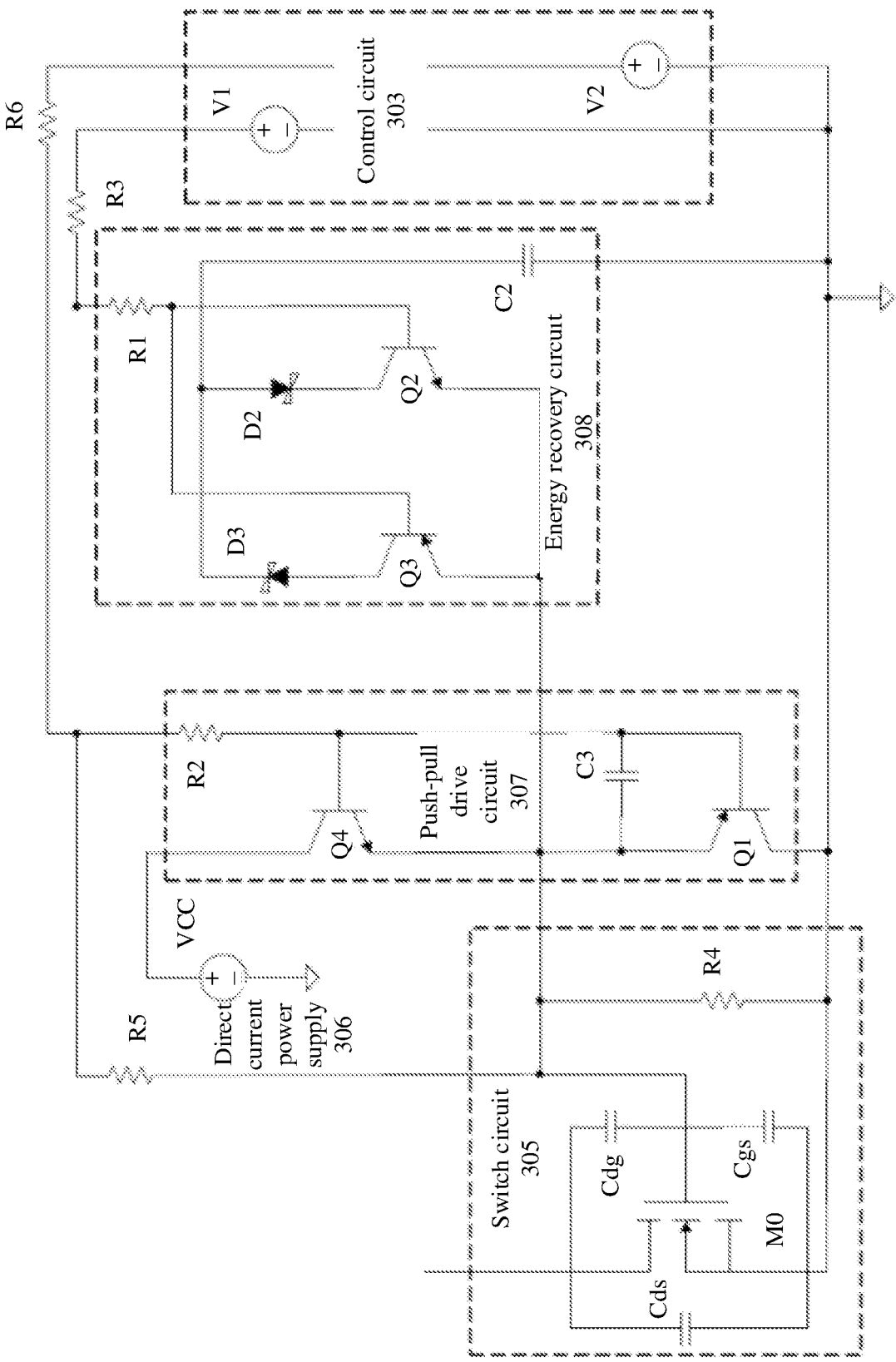
FIG. 6a is an example schematic diagram of a specific structure of another drive circuit with an energy recovery function according to an embodiment of this application.

Optionally, as shown in FIG. 5a or FIG. 6a, the switch circuit includes a resistor R4, a MOS transistor M0, a capacitor Cdg, and a capacitor Cgs. A first terminal of the resistor R4 is connected to a gate of the MOS transistor M0, two terminals of the capacitor Cdg are respectively connected to a drain and the gate of the MOS transistor M0, two terminals of the capacitor Cgs are respectively connected to the gate and a source of the MOS transistor, and the source of the MOS transistor M0 is connected to a second terminal of the resistor R4.

The second port 305b and the third port 305c of the switch circuit 305 respectively include the drain and the source of the MOS transistor M0. That a second port and a third port of the switch circuit 305 are connected and disconnected means that the drain and the source of the MOS transistor M0 are connected and disconnected.

In this application, the junction capacitor of the switch circuit 305 includes the capacitor Cdg and the capacitor Cgs.

Optionally, the switch circuit 305 further includes a capacitor Cds, and two terminals of the capacitor Cds are respectively connected to the drain and the source of the MOS transistor M0.

Optionally, the MOS transistor M0 is an NPN MOS transistor.

The MOS transistor may be, but is not limited to, a common silicon-based metal-oxide-semiconductor field-effect transistor (Si MOSFET), a silicon carbide high electron mobility transistor (SiC HEMT), a gallium nitride high electron mobility transistor (GaN HEMT), and the like.

Optionally, as shown in FIG. 5a or FIG. 6a, the push-pull drive circuit 307 includes an NPN triode Q1, a PNP triode Q4, a capacitor C3, and a resistor R2.

An emitter of the triode Q4 is connected to an emitter of the triode Q1, a base of the triode Q4 is connected to a base of the triode Q1, a second terminal of the resistor R2 is connected to the base of the triode Q4, a first terminal of the resistor R2 is connected between the emitter of the triode Q4 and the emitter of the triode Q1 through a resistor R5, a first terminal of the capacitor C3 is connected between the emitter of the triode Q4 and the emitter of the triode Q1, a second terminal of the capacitor C3 is connected between the base of the triode Q4 and the base of the triode Q1, and a collector of the triode Q1 is grounded.

Optionally, as shown in FIG. 5a or FIG. 6a, the energy recovery circuit 308 includes an NPN triode Q2, a PNP triode Q3, a clamping diode D2, a clamping diode D3, a capacitor C2, and a resistor R1, and the capacitor C2 is the energy storage capacitor in the energy recovery drive circuit 304.

An emitter of the triode Q2 is connected to an emitter of the triode Q3, both a base of the triode Q2 and a base of the triode Q3 are connected to a second terminal of the resistor R1, a collector of the triode Q2 is connected to a negative electrode of the diode D2, a collector of the triode Q3 is connected to a positive electrode of the diode D3, both a negative electrode of the diode D3 and a positive electrode of the diode D2 are connected to a first terminal of the capacitor C2, and a second terminal of the capacitor C2 is grounded.

Figure 7:
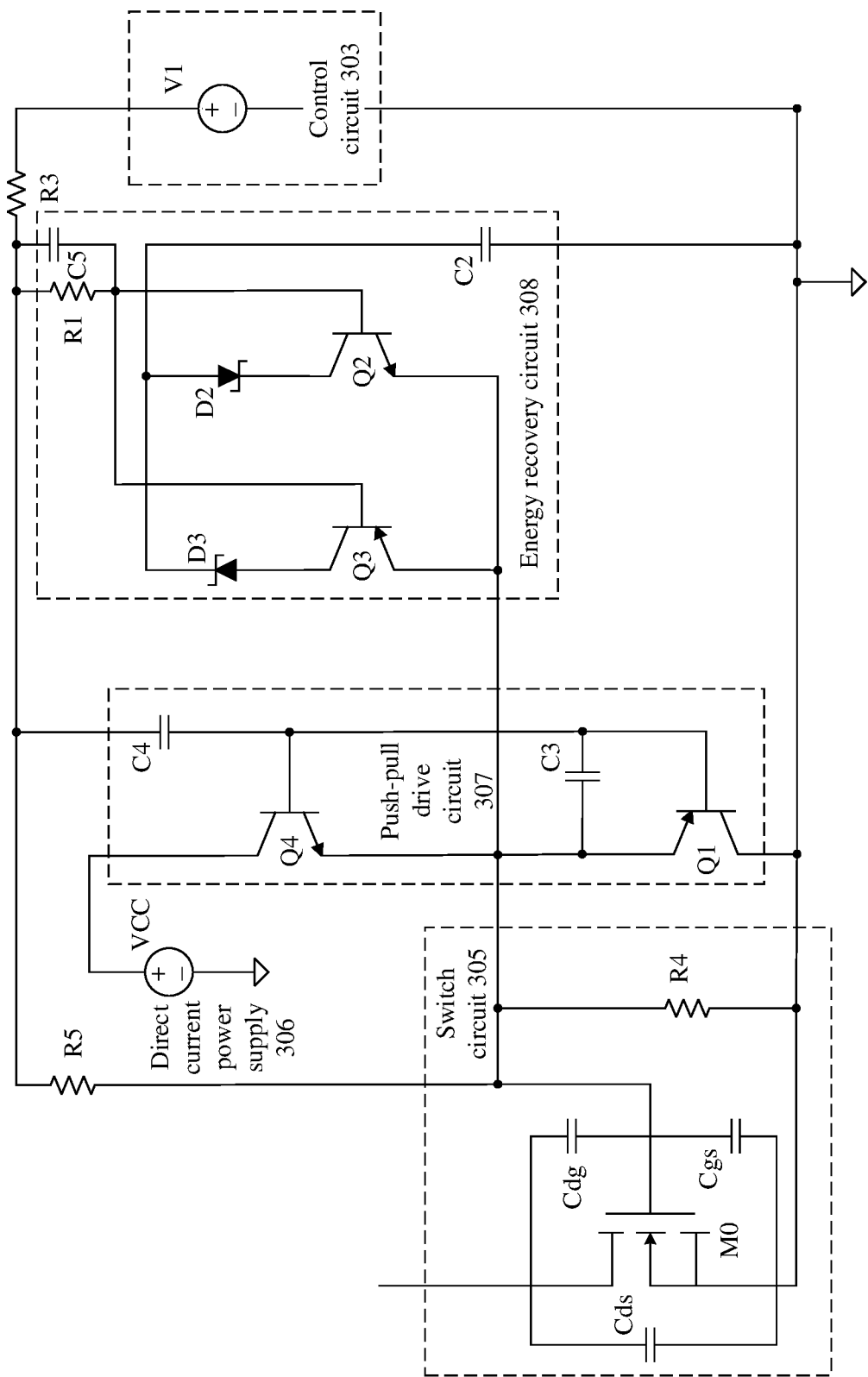
FIG. 7 is an example schematic diagram of a specific structure of another drive circuit with an energy recovery function according to an embodiment of this application.
Figure 8:
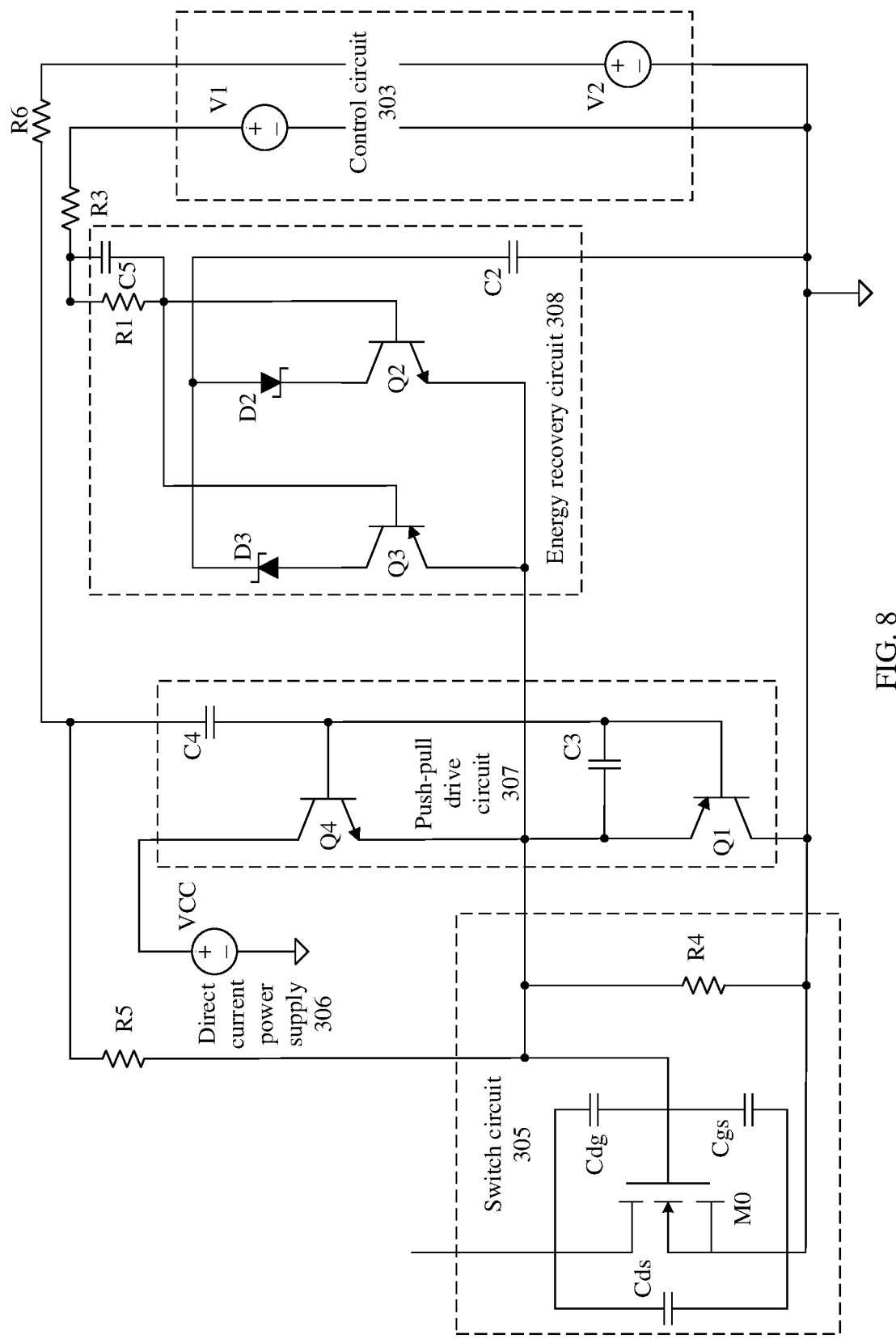
FIG. 8 is an example schematic diagram of a specific structure of another drive circuit with an energy recovery function according to an embodiment of this application.

Optionally, as shown in FIG. 7 or FIG. 8, the push-pull drive circuit includes an NPN triode Q1, a PNP triode Q4, a capacitor C3, and a capacitor C4.

An emitter of the triode Q4 is connected to an emitter of the triode Q1, a base of the triode Q4 is connected to a base of the triode Q1, a second terminal of the capacitor C4 is connected to the base of the triode Q4, a first terminal of the capacitor C4 is connected between the emitter of the triode Q4 and the emitter of the triode Q1 through a resistor R5, a first terminal of the capacitor C3 is connected between the emitter of the triode Q4 and the emitter of the triode Q1, a second terminal of the capacitor C3 is connected between the base of the triode Q4 and the base of the triode Q1, and a collector of the triode Q1 is grounded.

Optionally, as shown in FIG. 7 or FIG. 8, the energy recovery circuit includes an NPN triode Q2, a PNP triode Q3, a clamping diode D2, a clamping diode D3, a capacitor C2, a capacitor C5, and a resistor R1, and the capacitor C2 is the energy storage capacitor in the energy recovery drive circuit 304.

An emitter of the triode Q2 is connected to an emitter of the triode Q3, both a base of the triode Q2 and a base of the triode Q3 are connected to a second terminal of the resistor R1 and a second terminal of the capacitor C5, a first terminal of the resistor R1 is connected to a first terminal of the capacitor C5, a collector of the triode Q2 is connected to a negative electrode of the diode D2, a collector of the triode Q3 is connected to a positive electrode of the diode D3, both a negative electrode of the diode D3 and a positive electrode of the diode D2 are connected to a first terminal of the capacitor C2, and a second terminal of the capacitor C2 is grounded.

Optionally, a parameter of the clamping diode D2 is the same as that of the clamping diode D3.

Optionally, a parameter of the triode Q1 is the same as that of the triode Q3, and a parameter of the triode Q2 is the same as that of the triode Q4.

As shown in FIG. 5a or FIG. 6a, that both the second port 307b of the push-pull drive circuit 307 and the second port 308b of the energy recovery circuit 308 are connected to the first port 305a of the switch circuit 305 specifically includes:

the gate of the MOS transistor is connected between the emitter of the triode Q4 and the emitter of the triode Q1, and the source of the MOS transistor is connected to the collector of the triode Q1; and the gate of the MOS transistor is connected between the emitter of the triode Q2 and the emitter of the triode Q3, and the source of the MOS transistor is connected to the second terminal of the capacitor C2; and that the direct current power supply 306 is connected to the push-pull drive circuit specifically includes: a positive electrode of the direct current power supply 306 is connected to a collector of the triode Q4, and a negative electrode of the direct current power supply 306 is grounded.

The control circuit 303 includes a first drive signal generator V1, and that the control terminal 303a of the control circuit 303 is connected to both the first port 307a of the push-pull drive circuit 307 and the first port 308a of the energy recovery circuit 308 specifically includes:

as shown in FIG. 5a, a positive electrode of the first drive signal generator V1 is connected to the first terminal of the resistor R2 in the push-pull drive circuit 307 and the first terminal of the resistor R1 in the energy recovery circuit 308 through a resistor R3, and a negative electrode of the first drive signal generator V1 is grounded; or as shown in FIG. 7, a positive electrode of the first drive signal generator V1 is connected to the first terminal of the capacitor C4 in the push-pull drive circuit 307, the first terminal of the resistor R1 in the energy recovery circuit 308, and the first terminal of the capacitor C5 through a resistor R3.

Figure 5B:
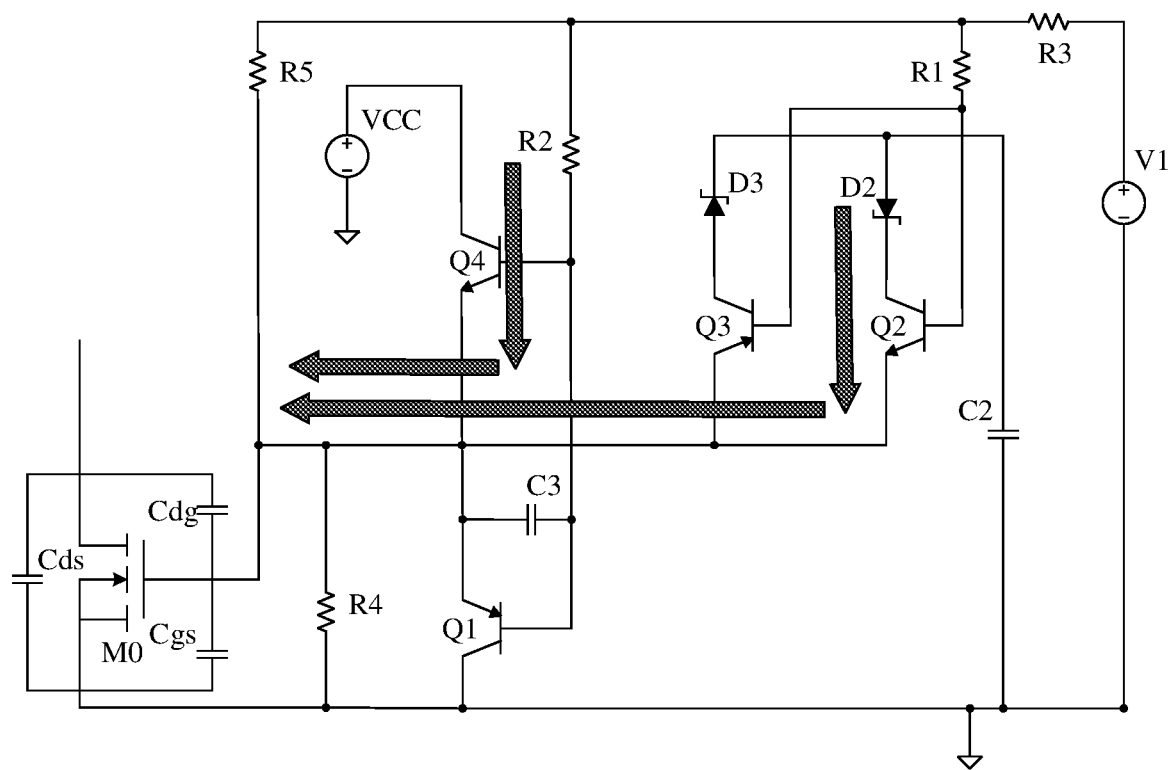
FIG. 5b is an example schematic diagram of an energy flow direction for a case that an energy storage capacitor charges a junction capacitor of a switch circuit.

Specifically, as shown in FIG. 5a, the first drive signal generator V1 outputs a drive signal. When a rising edge of the drive signal is output, a voltage of the first drive signal generator V1 output by the first drive signal generator gradually increases. In addition, when the voltage V1 output by the first drive signal generator V1 is greater than a breakover voltage Vbe2, for example, 0.7 V, of the triode Q2 in the energy recovery circuit 308 at the first moment, the collector and the emitter of the triode Q2 are connected, and the capacitor C2 of the energy recovery circuit 308 charges the capacitor Cdg and the capacitor Cgs of the switch circuit 305 through the diode D2 and the triode Q2 until a voltage on the capacitor C2 is less than that on the capacitor Cdg and the capacitor Cgs of the switch circuit 305. In this case, a voltage on the junction capacitor of the switch circuit 305 reaches an intermediate level. When the first drive signal generator V1 outputs the rising edge of the drive signal, the capacitor C3 is charged. When a voltage on the capacitor C3 is greater than a breakover voltage Vbe4, for example, 0.7 V, of the triode Q4 at the second moment, the collector and the emitter of the triode Q4 are connected, and the direct current power supply VCC charges the capacitor Cdg and the capacitor Cgs of the switch circuit 305 through the triode Q4 in the push-pull drive circuit 307 until the voltage on the capacitor Cdg and the capacitor Cgs is equal to a difference between a voltage of the direct current power supply VCC and a voltage drop Vce of the triode Q4. In this case, the voltage on the junction capacitor of the switch circuit 305 reaches a high level, and the switch circuit 305 is switched on. A loop for charging the capacitor Cdg and the capacitor Cgs of the switch circuit 305 is shown in FIG. 5b.

Figure 5C:
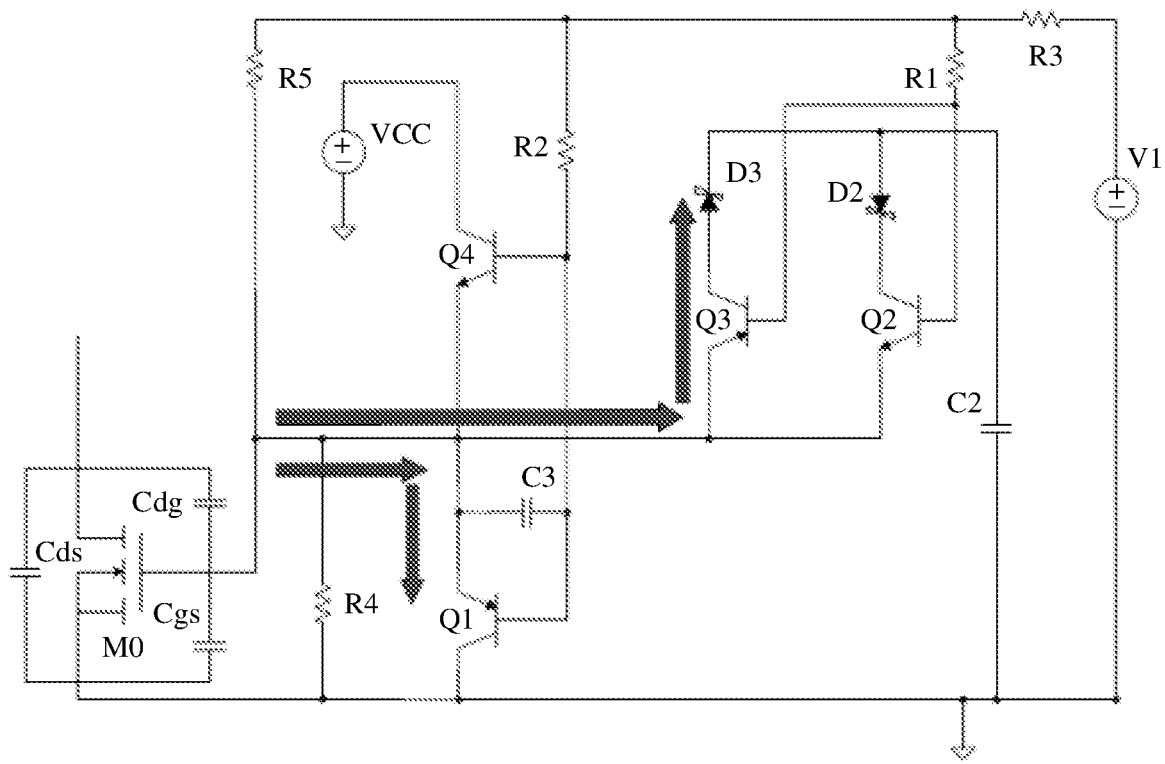
FIG. 5c is an example schematic diagram of an energy flow direction for a case that a junction capacitor of a switch circuit charges an energy storage capacitor.

When a falling edge of the drive signal is output, the voltage V1 output by the first drive signal generator V1 gradually decreases. When the difference between the voltage of the drive signal output by the first drive signal generator V1 and the voltage on the capacitor Cdg and the capacitor Cgs of the switch circuit 305 is greater than a breakover voltage Vbe3 of the triode Q3, the triode Q3 is switched on. The capacitor Cdg and the capacitor Cgs of the switch circuit 305 charge the capacitor C2 of the energy recovery circuit 308 through the diode D3 and the triode Q3 until the voltage on the capacitor Cdg and the capacitor Cgs of the switch circuit 305 is less than the voltage on the capacitor C2. In this case, the voltage on the capacitor Cdg and the capacitor Cgs of the switch circuit 305 drops from the high level to the intermediate level. As the voltage output by the first drive signal generator decreases, the voltage on the capacitor C3 gradually decreases. When the voltage on the capacitor C3 is less than a breakover voltage Vbe1, for example, −0.7 V of the triode Q1 at the fourth moment, the capacitor Cdg and the capacitor Cgs of the switch circuit 305 discharge to the ground through the triode Q1 in the push-pull drive circuit 307, so that the capacitor Cdg and the capacitor Cgs of the switch circuit 305 drop from the intermediate level to a low level, and the switch circuit 305 is switched off. A discharging loop for the capacitor Cdg and the capacitor Cgs of the switch circuit 305 is shown in FIG. 5c.

Figure 5D:
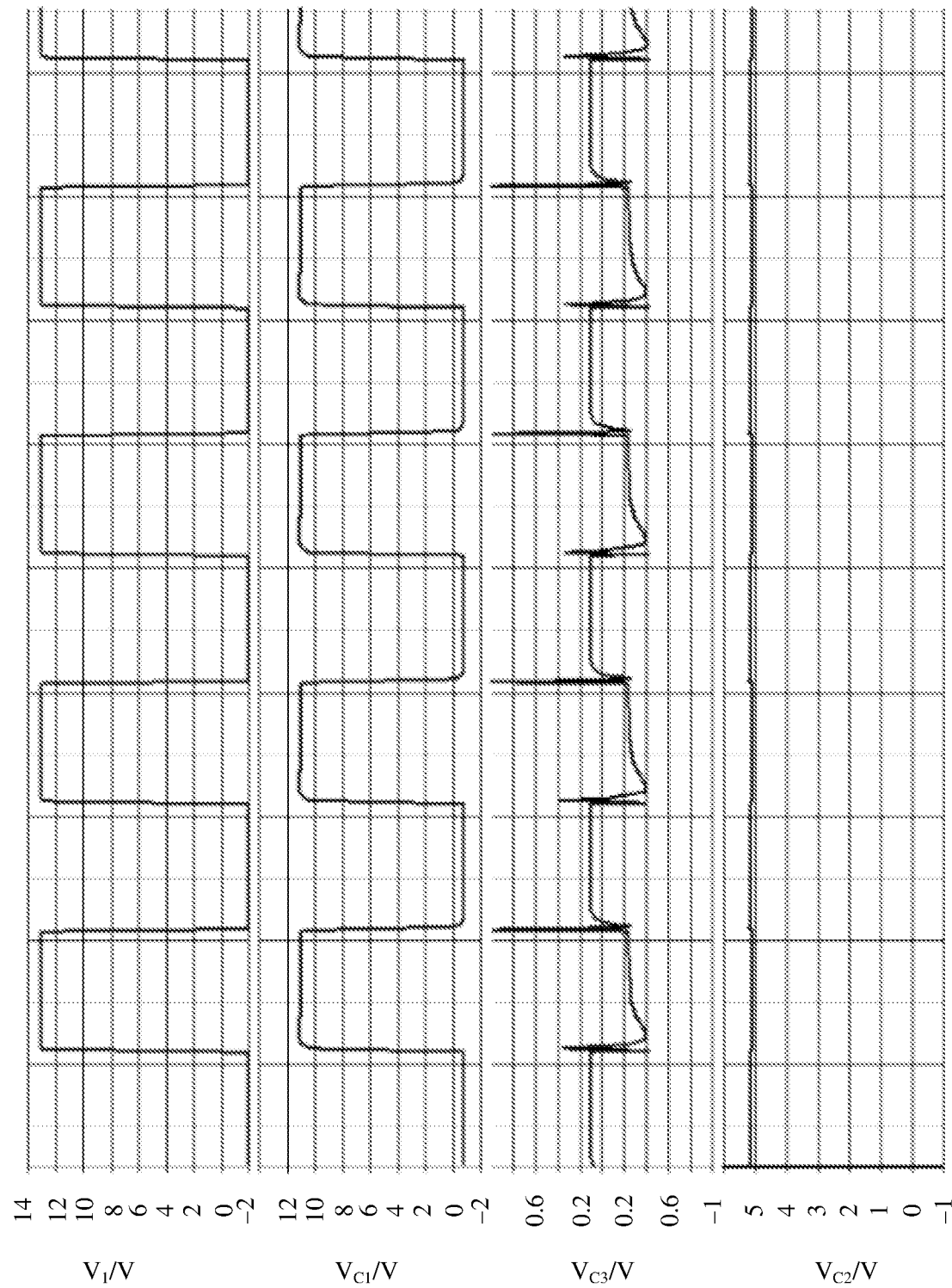
FIG. 5d is an example schematic diagram of a voltage change on each device during operation of a drive circuit with an energy recovery function according to an embodiment of this application.

FIG. 5d is a schematic diagram of a voltage change on each device during operation of the drive circuit shown in FIG. 5a. VC1 in FIG. 5d indicates the voltage on the capacitor Cdg and the capacitor Cgs. As shown in FIG. 5d, the first drive signal generator V1 outputs a square wave signal. As a rising edge of the square wave signal is output, a voltage Vbe2 between the base and the emitter of the triode Q2 gradually increases. When Vbe2 of the triode Q2 is greater than 0.7 V, the triode Q2 is switched on, the energy storage capacitor C2 charges the capacitor Cdg and the capacitor Cgs of the switch circuit 305 through the diode D2 and the triode Q2, a voltage on the energy storage capacitor C2 decreases, and a voltage on the capacitor Cdg and the capacitor Cgs increases until the voltage on the capacitor Cdg and the capacitor Cgs of the switch circuit 305 is greater than the voltage on the energy storage capacitor C2. A voltage on the capacitor C3 gradually increases with a voltage of the signal output by the first drive signal generator V1. When the voltage on the capacitor C3 is greater than a voltage between the base and the emitter of the triode Q4, the triode Q4 is switched on, and the power supply VCC charges the capacitor Cdg and the capacitor Cgs of the switch circuit 305 through the triode Q4, so that the drain and the source of the MOS transistor M0 of the switch circuit 305 are connected.

As the first drive signal generator V1 outputs a falling edge of the square wave signal, a voltage Vbe3 between the base and the emitter of the triode Q3 gradually decreases. When Vbe3 of the triode Q3 is less than (−0.7) V, the triode Q3 is switched on, the capacitor Cdg and the capacitor Cgs of the switch circuit 305 charge the energy storage capacitor C2 through the triode Q3 and the diode D3, the voltage on the capacitor Cdg and the capacitor Cgs of the switch circuit 305 decreases, and the voltage on the energy storage capacitor C2 increases until the voltage on the energy storage capacitor C2 is greater than the voltage on the capacitor Cdg and the capacitor Cgs of the switch circuit 305. The voltage on the capacitor C3 gradually decreases along with the voltage of the signal output by the first drive signal generator V1. When the voltage on the capacitor C3 is less than the voltage Vbe1 between the base and the emitter of the triode Q1, the triode Q1 is switched on, and the capacitor Cdg and the capacitor Cgs of the switch circuit 305 discharge to the ground through the triode Q1 until the voltage on the capacitor Cdg and the capacitor Cgs of the switch circuit 305 is 0, so that the drain and the source of the MOS transistor M0 of the switch circuit 305 are disconnected.

Herein, it should be noted that, for a specific operating principle of the circuit shown in FIG. 7, refer to related descriptions of the operating principle of FIG. 5a.

Herein, it should be noted that, in the circuits shown in FIG. 5a, FIG. 5b, FIG. 5c, and FIG. 7, the first moment and the second moment are moments in a process of outputting the rising edge of the drive signal by the first drive signal generator V1, and the first moment is earlier than the second moment; and the third moment and the fourth moment are moments in a process of outputting the falling edge of the drive signal by the first drive signal generator V1, and the third moment is earlier than the fourth moment. Optionally, the first moment may be earlier than the third moment, or the first moment is later than the fourth moment.

The control circuit 303 includes a first drive signal generator V1 and a second drive signal generator V2, and that the control circuit 303 is connected to both the push-pull drive circuit 307 and the energy recovery circuit 308 specifically includes:

as shown in FIG. 6a, a positive electrode of the first drive signal generator V1 is connected to the first terminal of the resistor R1 through a resistor R3, a negative electrode of the first drive signal generator V1 is grounded, a positive electrode of the second drive signal generator V2 is connected to the first terminal of the resistor R2 through a resistor R6, and a negative electrode of the second drive signal generator V2 is grounded; or as shown in FIG. 8, a positive electrode of the first drive signal generator V1 is connected to the first terminal of the resistor R1 through a resistor R3, a negative electrode of the first drive signal generator V1 is grounded, a positive electrode of the second drive signal generator V2 is connected to the first terminal of the capacitor C4 through a resistor R6, and a negative electrode of the second drive signal generator V2 is grounded.

Figure 6B:
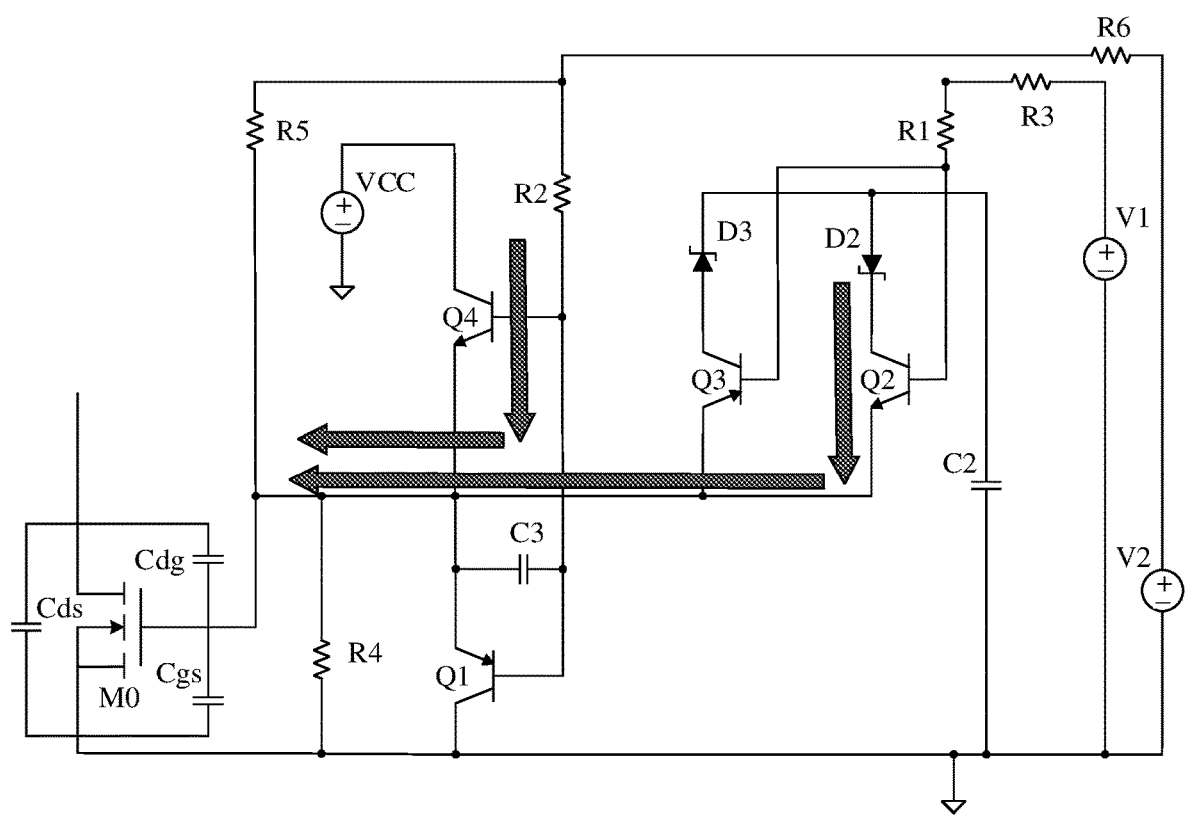
FIG. 6b is an example schematic diagram of an energy flow direction for a case that an energy storage capacitor charges a junction capacitor of a switch circuit.

Specifically, the first drive signal generator V1 outputs a drive signal. When a rising edge of the drive signal is output, a voltage V1 output by the first drive signal generator V1 gradually increases. In addition, when the voltage V1 output by the first drive signal generator is greater than a breakover voltage Vbe2, for example, 0.7 V, of the triode Q2 in the energy recovery circuit 308 at the first moment, the collector and the emitter of the triode Q2 are connected, and the capacitor C2 of the energy recovery circuit 308 charges the capacitor Cdg and the capacitor Cgs of the switch circuit 305 through the diode D2 and the triode Q2 until a voltage on the capacitor C2 is less than that on the capacitor Cdg and the capacitor Cgs of the switch circuit 305. In this case, a voltage on the junction capacitor of the switch circuit 305 reaches an intermediate level. When the second drive signal generator V2 outputs a rising edge of a drive signal, the capacitor C3 is charged. When a voltage on the capacitor C3 is greater than a breakover voltage Vbe4, for example, 0.7 V, of the triode Q4 at the second moment, the collector and the emitter of the triode Q4 are connected, and the power supply VCC charges the capacitor Cdg and the capacitor Cgs of the switch circuit 305 through the triode Q4 in the push-pull drive circuit 307 until the voltage on the capacitor Cdg and the capacitor Cgs is equal to a difference between a voltage of the power supply VCC and a voltage drop Vce of the triode Q4. In this case, the voltage on the junction capacitor of the switch circuit 305 reaches a high level, and the switch circuit 305 is switched on. A loop for charging the capacitor Cdg and the capacitor Cgs of the switch circuit 305 is shown in FIG. 6b.

Figure 6C:
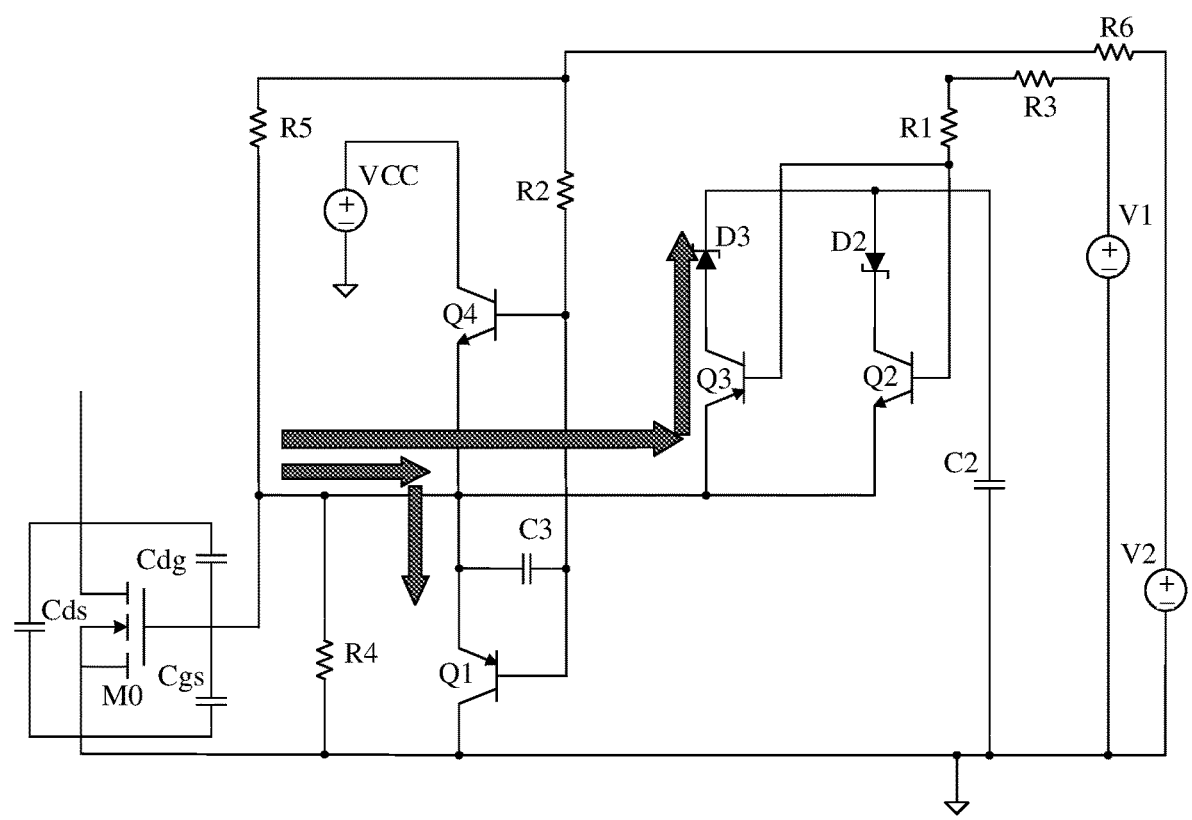
FIG. 6c is an example schematic diagram of an energy flow direction for a case that a junction capacitor of a switch circuit charges an energy storage capacitor.

When the first drive signal generator V1 outputs a falling edge of the drive signal, the voltage V1 output by the first drive signal generator V1 gradually decreases. When the difference between the voltage of the drive signal output by the first drive signal generator V1 and the voltage on the capacitor Cdg and the capacitor Cgs is greater than a breakover voltage Vbe3 of the triode Q3, the collector and the emitter of the triode Q3 are connected. The capacitor Cdg and the capacitor Cgs of the switch circuit 305 charge the capacitor C2 of the energy recovery circuit 308 through the triode D3 and the triode Q3 until the voltage on the capacitor Cdg and the capacitor Cgs of the switch circuit 305 is less than the voltage on the capacitor C2. In this case, the voltage on the capacitor Cdg and the capacitor Cgs of the switch circuit 305 drops from the high level to the intermediate level. When the second drive signal generator V2 outputs a falling edge of the drive signal, the voltage of the drive signal output by the second drive signal generator V2 gradually decreases. As the voltage of the drive signal output by the second drive signal generator V2 decreases, the voltage on the capacitor C3 gradually decreases. When the voltage on the capacitor C3 is less than a breakover voltage Vbe1, for example, −0.7 V, of the triode Q1 at the fourth moment, the capacitor Cdg and the capacitor Cgs of the switch circuit 305 discharge to the ground through the triode Q1 in the push-pull drive circuit 307, so that the capacitor Cdg and the capacitor Cgs of the switch circuit 305 drop from the intermediate level to a low level, and the switch circuit 305 is switched off. A discharging loop for the capacitor Cdg and the capacitor Cgs of the switch circuit 305 is shown in FIG. 6c.

Delays of the first drive signal generator and the second drive signal generator are adjusted to achieve the objective that the first moment is earlier than the second moment and the third moment is earlier than the fourth moment. In a process of driving a rising edge, a drive signal of the energy recovery circuit 308 precedes a drive signal of the push-pull drive circuit 307. In a process of driving a falling edge, a drive signal of the energy recovery circuit 308 still precedes a drive signal of the push-pull drive circuit 307. In this way, the energy recovery circuit 308 provides an intermediate level, to provide a part of drive energy during switching-on, and recover a part of drive energy stored on the capacitor Cdg and capacitor Cgs of the switch circuit 305 during switching-off.

After a drive voltage rises to the voltage on the capacitor C2 of the energy recovery circuit 308, the drive circuit is properly driven to provide a voltage required for fully switching on or off the switch circuit 305, that is, a high level or a low level. During switching-on, energy required by the capacitor Cdg and the capacitor Cgs of the switch circuit 305 to rise from an intermediate level to a specified voltage corresponding to driving to full switching-on is supplemented. During switching-off, energy that remains on the junction capacitor of the switch circuit 305 after recovery is extracted to reach a specified voltage corresponding to driving to a switched-off state. Therefore, it can be considered that the drive circuit is a three-level drive circuit, that is, a high level, an intermediate level, and a low level.

Optionally, the first drive signal generator V1 or the second drive signal generator V2 may be a drive chip, and the drive chip may be constituted by a resistor and a diode that includes a push-pull circuit and a corresponding drive amplifier circuit, where the push-pull circuit includes a MOS transistor. A front-end input signal of the drive chip is used to adjust operating statuses of a push-pull drive circuit and an energy recovery drive circuit. A drive signal of the drive chip may be implemented by a control chip or a logic gate.

Herein, it should be noted that, for a specific operating principle of the circuit shown in FIG. 8, refer to related descriptions of the operating principle of FIG. 6a.

Herein, it should be noted that, in the circuits shown in FIG. 6a, FIG. 6b, FIG. 6c, and FIG. 8, the first moment and the second moment are moments in a process of outputting the rising edge of the drive signal by the first drive signal generator V1, and the first moment is earlier than the second moment; and the third moment and the fourth moment are moments in a process of outputting the falling edge of the drive signal by the second drive signal generator V2, and the third moment is earlier than the fourth moment. Optionally, the first moment may be earlier than the third moment, or the first moment is later than the fourth moment.

By controlling timings of outputting signals by the first drive signal generator V1 and the second drive signal generator V2, the signal output by the first drive signal generator V1 in FIG. 5a may be output based on the first drive signal generator V1 and the second drive signal generator V2.

The resistor R1 is configured to provide a pulse control signal for the energy recovery circuit 308, so that the corresponding triodes Q2 and Q3 operate in a saturated state. In addition, the resistor R1 is also a drive current-limiting resistor, and a base current Ib of the triodes Q2 and Q3 may be adjusted to adjust a size of a current at which the energy recovery circuit 308 charges and discharges the capacitor Cdg and the capacitor Cgs of the switch circuit.

The diode D2 is configured to: serve as a part of a charge/discharge conduction loop of the triode Q2; and with a reverse cut-off characteristic of the diode D2, prevent a CE junction of the triode Q2 from being damaged due to a reverse voltage after the drive voltage of the capacitor Cdg and the capacitor Cgs of the switch circuit 305 is greater than the voltage on the capacitor C2 of the energy recovery circuit 308. Similarly, the diode D3 is configured to: serve as a part of a charge/discharge conduction loop of the triode Q3; and prevent a CE junction of the triode Q3 from being damaged due to a reverse voltage after the drive voltage of the capacitor Cdg and the capacitor Cgs of the switch circuit 305 is less than the voltage on the capacitor C2 of the energy recovery circuit 308.

R2 and C3 are configured to provide a pulse control signal for the push-pull drive circuit 307. In addition, values of R2 and C3 may be adjusted, that is, time constants of R2 and C3 may be adjusted, to adjust an operating time difference between the triodes Q2 and Q3 in the energy recovery circuit 308 and the triodes Q1 and Q4 in the push-pull drive circuit 307. The time difference may also be considered as a difference between a time at which the energy recovery circuit 308 starts to operate and a time at which the push-pull drive circuit 307 starts to operate. After the voltage on the capacitor Cdg and the capacitor Cgs of the switch circuit 305 reaches the intermediate level generated by the energy recovery circuit 308, the push-pull drive circuit 307 needs to quickly perform a switchover, and the direct current power supply 306 in place of the energy recovery circuit 308 continues to charge the capacitor Cdg and the capacitor Cgs of the switch circuit 305. In addition, R2 is also a drive current-limiting resistor, and a value of the resistor R2 may be adjusted to adjust a base current Ib of the triodes Q1 and Q4, so as to adjust a size of a current at which the push-pull drive circuit 307 charges and discharges the capacitor Cdg and the capacitor Cgs of the switch circuit.

Optionally, a rising edge speed and a falling edge speed of the drive signal output by the first drive signal generator may be adjusted.

The capacitor C2 is configured to: in a process of charging the capacitor Cdg and the capacitor Cgs of the switch circuit 305, provide energy required for the voltage on the capacitor Cdg and the capacitor Cgs of the switch circuit 305 to reach an intermediate-level voltage; and in a process in which the capacitor Cdg and the capacitor Cgs of the switch circuit 305 discharge, recover energy released for the voltage on the capacitor Cdg and the capacitor Cgs of the switch circuit 305 to reach the intermediate-level voltage. After a system including the switch mode power supply 30 and the switch circuit 305 reaches a steady state, the voltage on C2 is stabilized at half of the voltage of the direct current power supply VCC. In addition, a capacity of C2 needs to be greater than 100 times a capacity of the junction capacitor of the switch circuit, to avoid an excessive voltage fluctuation on the capacitor C2.

R5 is configured to provide a discharge circuit for the capacitor Cdg and the capacitor Cgs of the switch circuit 305 after a voltage output by the control circuit 303 becomes less than a breakover voltage Vbe corresponding to the triode Q4 or Q1, to ensure reliable switching-off of the switch circuit 305.

Herein, it should be noted that the capacitor C4 in FIG. 7 and FIG. 8 has a same function as that of the resistor R2 in FIG. 5a and FIG. 6a, and the capacitor C5 and the resistor R1 in FIG. 7 and FIG. 8 have a same function as that of the resistor R1 in FIG. 5a and FIG. 6a. When the first drive signal generator V1 outputs a steady-state level, the resistor R1 is configured to clamp a voltage on the capacitor C5.

In a specific example, parameters of the devices in FIG. 5a, FIG. 5b, FIG. 5c, FIG. 6a, FIG. 6b, FIG. 6c, FIG. 7, and FIG. 8 are as follows: A capacitance of the capacitor C2 is 100 nF, a capacitance of the capacitor C3 is 4.8 nF, a capacitance of the capacitor C4 is 2 nF, a capacitance of the capacitor C5 is 1 nF, a resistance of the resistor R1 is 22Ω, a resistance of the resistor R2 is 47Ω, a resistance of the resistor R3 is 3Ω, a resistance of the resistor R4 is 10 kΩ, a resistance of the resistor R5 is 220Ω, models of the diode D2 and the diode D3 are MBRS130L, models of the triode Q1 and the triode Q3 are 2N2907, and models of the triode Q2 and the triode Q4 are 2N2219A.

Optionally, the triodes in the push-pull drive circuit may be replaced with MOS transistors.

It can be learned that, in the solutions of this application, in a process of charging the junction capacitor of the switch circuit, the energy recovery circuit is controlled to operate first so that the energy storage capacitor C2 in the energy recovery circuit charges the junction capacitor of the switch circuit, and then the push-pull drive circuit is controlled to operate so that the power supply VCC charges the junction capacitor of the switch circuit; and when the junction capacitor of the switch circuit discharges, the energy recovery circuit is controlled to operate first so that the junction capacitor of the switch circuit charges the energy storage capacitor C2 in the energy recovery circuit, and then the push-pull drive circuit is controlled to operate so that the junction capacitor of the switch circuit discharges to the ground.

By controlling an operating sequence of the energy recovery circuit and the push-pull drive circuit, a part of drive energy stored on the junction capacitor of the switch circuit is transferred to the energy storage capacitor in the energy recovery drive circuit, to recover and reuse the drive energy and prevent all drive energy from being consumed on a drive resistor and the push-pull drive circuit. This greatly reduces driving loss, so that overall system efficiency is higher.

Embodiments of this application are described in detail above. The principle and implementation of this application are described herein through specific examples. The descriptions about embodiments are merely provided to help understand the method and core ideas of this application. In addition, a person of ordinary skill in the art can make variations and modifications to this application in terms of the specific implementations and application scopes according to the ideas of this application. Therefore, the content of this specification shall not be construed as a limit to this application.

What is claimed is:

1. A drive circuit configured to include an energy recovery function, the drive circuit comprising:
a control circuit;
an energy recovery drive circuit;
a switch circuit; and
a direct current power supply, wherein
the control circuit is operatively coupled to the energy recovery drive circuit, the energy recovery drive circuit is operatively coupled to the switch circuit, and the direct current power supply is operatively coupled to the energy recovery drive circuit,
the control circuit is configured to control the energy recovery drive circuit to enable an energy storage capacitor in the energy recovery drive circuit to charge a junction capacitor of the switch circuit at a first moment, and enable the direct current power supply to charge the junction capacitor of the switch circuit through the energy recovery drive circuit at a second moment, thereby turning on the switch circuit, and
the control circuit is further configured to control the energy recovery drive circuit to enable the junction capacitor of the switch circuit to charge the energy storage capacitor in the energy recovery drive circuit at a third moment, and enable the junction capacitor of the switch circuit to discharge to a ground through the energy recovery drive circuit at a fourth moment, thereby turning off the switch circuit, wherein
the energy recovery drive circuit comprises:
a push-pull drive circuit; and
an energy recovery circuit, wherein
the control circuit is operatively coupled to the push-pull drive circuit and the energy recovery circuit, the push-pull drive circuit and the energy recovery circuit are operatively coupled to the switch circuit, and the direct current power supply is operatively coupled to the push-pull drive circuit,
the control circuit is configured to control the energy recovery drive circuit to enable the energy storage capacitor in the energy recovery drive circuit to charge the junction capacitor of the switch circuit at the first moment, and enable the direct current power supply to charge the junction capacitor of the switch circuit through the energy recovery drive circuit at the second moment comprises:
the control circuit is configured to control the energy recovery circuit to enable the energy storage capacitor in the energy recovery circuit to charge the junction capacitor of the switch circuit at the first moment, and control the push-pull drive circuit to enable the direct current power supply to charge the junction capacitor of the switch circuit through the push-pull drive circuit at the second moment; and
the control circuit is further configured to control the energy recovery drive circuit to enable the junction capacitor of the switch circuit to charge the energy storage capacitor in the energy recovery drive circuit at the third moment, and enable the junction capacitor of the switch circuit to discharge to the ground through the energy recovery drive circuit at the fourth moment comprises:
the control circuit is configured to control the energy recovery circuit to enable the junction capacitor of the switch circuit to charge the energy storage capacitor in the energy recovery circuit at the third moment, and control the push-pull drive circuit to enable the junction capacitor of the switch circuit to discharge to the ground through the push-pull drive circuit at the fourth moment.

2. The drive circuit according to claim 1, wherein the switch circuit comprises:
a resistor R4;
a MOS transistor M0;
a capacitor Cdg; and
a capacitor Cgs, wherein
a first terminal of the resistor R4 is operatively coupled to a gate of the MOS transistor M0, two terminals of the capacitor Cdg are respectively operatively coupled to a drain and the gate of the MOS transistor M0, two terminals of the capacitor Cgs are respectively operatively coupled to a source and the gate of the MOS transistor, and the source of the MOS transistor M0 is operatively coupled to a second terminal of the resistor R4,
the switch circuit is switched on includes the drain and the source of the MOS transistor M0 are connected,
the switch circuit is switched off includes the drain and the source of the MOS transistor M0 are disconnected, and
the junction capacitor of the switch circuit comprises the capacitor Cdg and the capacitor Cgs.

3. The drive circuit according to claim 2, wherein the push-pull drive circuit comprises:
an NPN triode Q1;
a PNP triode Q4;
a capacitor C3; and
a resistor R2, wherein
an emitter of the triode Q4 is operatively coupled to an emitter of the triode Q1,
a base of the triode Q4 is operatively coupled to a base of the triode Q1,
a second terminal of the resistor R2 is operatively coupled to the base of the triode Q4,
a first terminal of the resistor R2 is operatively coupled between the emitter of the triode Q4 and the emitter of the triode Q1 through a resistor R5,
a first terminal of the capacitor C3 is operatively coupled between the emitter of the triode Q4 and the emitter of the triode Q1,
a second terminal of the capacitor C3 is operatively coupled between the base of the triode Q4 and the base of the triode Q1, and
a collector of the triode Q1 is grounded.

4. The drive circuit according to claim 3, wherein the energy recovery circuit comprises:
an NPN triode Q2;
a PNP triode Q3;
a clamping diode D2;
a clamping diode D3;
a capacitor C2; and
a resistor R1, wherein
the capacitor C2 is the energy storage capacitor in the energy recovery drive circuit,
an emitter of the triode Q2 is operatively coupled to an emitter of the triode Q3,
a base of the triode Q2 and a base of the triode Q3 are operatively coupled to a second terminal of the resistor R1,
a collector of the triode Q2 is operatively coupled to a negative electrode of the diode D2,
a collector of the triode Q3 is operatively coupled to a positive electrode of the diode D3, a negative electrode of the diode D3 and a positive electrode of the diode D2 are operatively coupled to a first terminal of the capacitor C2, and a second terminal of the capacitor C2 is grounded.

5. The drive circuit according to claim 2, wherein the push-pull drive circuit comprises:

an NPN triode Q1;
a PNP triode Q4;
a capacitor C3; and
a capacitor C4, wherein
an emitter of the triode Q4 is operatively coupled to an emitter of the triode Q1,
a base of the triode Q4 is operatively coupled to a base of the triode Q1,
a second terminal of the capacitor C4 is operatively coupled to the base of the triode Q4,
a first terminal of the capacitor C4 is operatively coupled between the emitter of the triode Q4 and the emitter of the triode Q1 through a resistor R5,
a first terminal of the capacitor C3 is operatively coupled between the emitter of the triode Q4 and the emitter of the triode Q1,
a second terminal of the capacitor C3 is operatively coupled between the base of the triode Q4 and the base of the triode Q1, and
a collector of the triode Q1 is grounded.

6. The drive circuit according to claim 5, wherein the energy recovery circuit comprises:

an NPN triode Q2;
a PNP triode Q3;
a clamping diode D2;
a clamping diode D3;
a capacitor C2;
a capacitor C5; and
a resistor R1, wherein
the capacitor C2 is the energy storage capacitor in the energy recovery drive circuit,
an emitter of the triode Q2 is operatively coupled to an emitter of the triode Q3,
a base of the triode Q2 and a base of the triode Q3 are operatively coupled to a second terminal of the resistor R1 and a second terminal of the capacitor C5,
a first terminal of the resistor R1 is operatively coupled to a first terminal of the capacitor C5,
a collector of the triode Q2 is operatively coupled to a negative electrode of the diode D2,
a collector of the triode Q3 is operatively coupled to a positive electrode of the diode D3,
a negative electrode of the diode D3 and a positive electrode of the diode D2 are operatively coupled to a first terminal of the capacitor C2, and
a second terminal of the capacitor C2 is grounded.

7. The drive circuit according to claim 4, wherein the push-pull drive circuit and the energy recovery circuit are operatively coupled to the switch circuit comprises:

the gate of the MOS transistor is operatively coupled between the emitter of the triode Q4 and the emitter of the triode Q1, and the source of the MOS transistor is operatively coupled to the collector of the triode Q1, and
the gate of the MOS transistor is operatively coupled between the emitter of the triode Q2 and the emitter of the triode Q3, and the source of the MOS transistor is operatively coupled to the second terminal of the capacitor C2, and the direct current power supply is operatively coupled to the push-pull drive circuit comprises:

a positive electrode of the direct current power supply is operatively coupled to a collector of the triode Q4, and a negative electrode of the direct current power supply is grounded.

8. The drive circuit according to claim 7, wherein the control circuit comprises:

a first drive signal generator, wherein
the control circuit is operatively coupled to the push-pull drive circuit and the energy recovery circuit comprises:
a positive electrode of the first drive signal generator is operatively coupled to the first terminal of the resistor R2 and the first terminal of the resistor R1 through a resistor R3, and a negative electrode of the first drive signal generator is grounded, or
a positive electrode of the first drive signal generator is operatively coupled to the first terminal of the capacitor C4 and the first terminal of the resistor R1 through a resistor R3, and a negative electrode of the first drive signal generator is grounded.

9. The drive circuit according to claim 8, wherein the control circuit is configured to control the energy recovery circuit to enable the energy storage capacitor in the energy recovery circuit to charge the junction capacitor of the switch circuit at the first moment comprises:

the first drive signal generator is configured to output a rising edge of a drive signal, and a voltage output by the first drive signal generator is greater than a breakover voltage of the triode Q2 at the first moment, thereby enabling the capacitor C2 to charge the capacitor Cgs and the capacitor Cdg through the diode D2 and the triode Q2, and the control circuit is configured to control the push-pull drive circuit to enable the direct current power supply to charge the junction capacitor of the switch circuit through the push-pull drive circuit at the second moment comprises:

the first drive signal generator is configured to output a rising edge of a drive signal, and charge the capacitor C3, so that a voltage on the capacitor C3 is greater than a breakover voltage of the triode Q4 at the second moment, and the direct current power supply charges the capacitor Cgs and the capacitor Cdg through the triode Q4.

10. The drive circuit according to claim 8, wherein the control circuit is configured to control the energy recovery circuit to enable the junction capacitor of the switch circuit to charge the energy storage capacitor in the energy recovery circuit at the third moment comprises:

the first drive signal generator is configured to output a falling edge of a drive signal, and a difference between a voltage of the drive signal and a voltage on the capacitor Cdg and the capacitor Cgs of the switch circuit is greater than a breakover voltage of the triode Q3 at the third moment, so that the capacitor Cdg and the capacitor Cgs of the switch circuit charge the capacitor C2 through the triode Q3 and the diode D3, and the control circuit is configured to control the push-pull drive circuit to enable the junction capacitor of the switch circuit to discharge to the ground through the push-pull drive circuit at the fourth moment comprises:

the first drive signal generator is configured to output a falling edge of a drive signal, and the voltage on the capacitor C3 is made greater than a breakover voltage of the triode Q1 at the fourth moment, so that the capacitor Cgs and the capacitor Cdg discharge to the ground through the triode Q1.

11. The drive circuit according to claim 7, wherein the control circuit comprises:
a first drive signal generator; and
a second drive signal generator, wherein
the control circuit is connected to the push-pull drive circuit and the energy recovery circuit comprises:
a positive electrode of the first drive signal generator is operatively coupled to the first terminal of the resistor R1 through a resistor R3, a negative electrode of the first drive signal generator is grounded, a positive electrode of the second drive signal generator is operatively coupled to the first terminal of the resistor R2 through a resistor R6, and a negative electrode of the second drive signal generator is grounded, or
a positive electrode of the first drive signal generator is operatively coupled to the first terminal of the resistor R1 through a resistor R3, a negative electrode of the first drive signal generator is grounded, a positive electrode of the second drive signal generator is operatively coupled to the first terminal of the capacitor C4 through a resistor R6, and a negative electrode of the second drive signal generator is grounded.

12. The drive circuit according to claim 11, wherein the control circuit is configured to control the energy recovery circuit to enable the energy storage capacitor in the energy recovery circuit to charge the junction capacitor of the switch circuit at the first moment comprises:
the first drive signal generator is configured to output a rising edge of a drive signal, and a voltage of the drive signal is greater than a breakover voltage of the triode Q3 at the first moment, so that the capacitor C2 charges the capacitor Cgs and the capacitor Cdg through the diode D2 and the triode Q2, and
the control circuit is configured to control the push-pull drive circuit to enable the direct current power supply to charge the junction capacitor of the switch circuit through the push-pull drive circuit at the second moment comprises:
the second drive signal generator is configured to output a rising edge of a drive signal, and charge the capacitor C3, so that a voltage on the capacitor C3 is greater than a breakover voltage of the triode Q4 at the second moment, and the direct current power supply charges the capacitor Cgs and the capacitor Cdg through the triode Q4.

13. The drive circuit according to claim 11, wherein the control circuit is configured to control the energy recovery circuit to enable the junction capacitor of the switch circuit to charge the energy storage capacitor in the energy recovery circuit at the third moment comprises:
the first drive signal generator is configured to output a falling edge of a drive signal, and a difference between a voltage output by the first drive signal generator and a voltage on the capacitor Cgs and the capacitor Cdg is greater than a breakover voltage of the triode Q3 at the third moment, so that the capacitor Cgs and the capacitor Cdg charge the capacitor C2 through the triode Q3 and the diode D3, and
the control circuit is configured to control the push-pull drive circuit to enable the junction capacitor of the switch circuit to discharge to the ground through the push-pull drive circuit at the fourth moment comprises:
the second drive signal generator is configured to output a falling edge of a drive signal, and the voltage on the capacitor C3 is made greater than a breakover voltage of the triode Q1 at the fourth moment, so that the capacitor Cgs and the capacitor Cdg discharge to the ground through the triode Q1.

14. A switch mode power supply, comprising:
a drive circuit, wherein the drive circuit comprises:
a control circuit;
an energy recovery drive circuit;
a switch circuit; and
a direct current power supply, wherein
the control circuit is operatively coupled to the energy recovery drive circuit, the energy recovery drive circuit is operatively coupled to the switch circuit, and the direct current power supply is operatively coupled to the energy recovery drive circuit,
the control circuit is configured to control the energy recovery drive circuit to enable an energy storage capacitor in the energy recovery drive circuit to charge a junction capacitor of the switch circuit at a first moment, and enable the direct current power supply to charge the junction capacitor of the switch circuit through the energy recovery drive circuit at a second moment, thereby turning on the switch circuit, and
the control circuit is further configured to control the energy recovery drive circuit to enable the junction capacitor of the switch circuit to charge the energy storage capacitor in the energy recovery drive circuit at a third moment, and enable the junction capacitor of the switch circuit to discharge to a ground through the energy recovery drive circuit at a fourth moment, thereby turning off the switch circuit, wherein
the energy recovery drive circuit comprises:
a push-pull drive circuit; and
an energy recovery circuit, wherein
the control circuit is operatively coupled to the push-pull drive circuit and the energy recovery circuit, the push-pull drive circuit and the energy recovery circuit are operatively coupled to the switch circuit, and the direct current power supply is operatively coupled to the push-pull drive circuit,
the control circuit is configured to control the energy recovery drive circuit to enable the energy storage capacitor in the energy recovery drive circuit to charge the junction capacitor of the switch circuit at the first moment, and enable the direct current power supply to charge the junction capacitor of the switch circuit through the energy recovery drive circuit at the second moment comprises:
the control circuit is configured to control the energy recovery circuit to enable the energy storage capacitor in the energy recovery circuit to charge the junction capacitor of the switch circuit at the first moment, and control the push-pull drive circuit to enable the direct current power supply to charge the junction capacitor of the switch circuit through the push-pull drive circuit at the second moment; and
the control circuit is further configured to control the energy recovery drive circuit to enable the junction capacitor of the switch circuit to charge the energy storage capacitor in the energy recovery drive circuit at the third moment, and enable the junction capacitor of the switch circuit to discharge to the ground through the energy recovery drive circuit at the fourth moment comprises:

the control circuit is configured to control the energy recovery circuit to enable the junction capacitor of the switch circuit to charge the energy storage capacitor in the energy recovery circuit at the third moment, and control the push-pull drive circuit to enable the junction capacitor of the switch circuit to discharge to the ground through the push-pull drive circuit at the fourth moment.

15. The switch mode power supply of claim 14, wherein the switch circuit comprises:

a resistor R4;

a MOS transistor M0;

a capacitor Cdg; and a capacitor Cgs, wherein a first terminal of the resistor R4 is operatively coupled to a gate of the MOS transistor M0, two terminals of the capacitor Cdg are respectively operatively coupled to a drain and the gate of the MOS transistor M0, two terminals of the capacitor Cgs are respectively operatively coupled to a source and the gate of the MOS transistor, and the source of the MOS transistor M0 is operatively coupled to a second terminal of the resistor R4, the switch circuit is switched on includes the drain and the source of the MOS transistor M0 are connected, the switch circuit is switched off includes the drain and the source of the MOS transistor M0 are disconnected, and the junction capacitor of the switch circuit comprises the capacitor Cdg and the capacitor Cgs.

16. A drive circuit, comprising:

a control circuit;

an energy recovery drive circuit having an energy storage capacitor;

a switch circuit having a junction capacitor; and a direct current power supply, wherein the control circuit is configured to control the energy recovery drive circuit to enable the energy storage capacitor to charge the junction capacitor at a first moment, and enable the direct current power supply to charge the junction capacitor through the energy recovery drive circuit at a second moment, and the control circuit is further configured to control the energy recovery drive circuit to enable the junction capacitor to charge the energy storage capacitor at a third moment, and enable the junction capacitor to discharge to a ground through the energy recovery drive circuit at a fourth moment, wherein the energy recovery drive circuit comprises:

a push-pull drive circuit; and an energy recovery circuit, wherein the control circuit is operatively coupled to the push-pull drive circuit and the energy recovery circuit, the push-pull drive circuit and the energy recovery circuit are operatively coupled to the switch circuit, and the direct current power supply is operatively coupled to the push-pull drive circuit, the control circuit is configured to control the energy recovery drive circuit to enable the energy storage capacitor in the energy recovery drive circuit to charge the junction capacitor of the switch circuit at the first moment, and enable the direct current power supply to charge the junction capacitor of the switch circuit through the energy recovery drive circuit at the second moment comprises:

the control circuit is configured to control the energy recovery circuit to enable the energy storage capacitor in the energy recovery circuit to charge the junction capacitor of the switch circuit at the first moment, and control the push-pull drive circuit to enable the direct current power supply to charge the junction capacitor of the switch circuit through the push-pull drive circuit at the second moment; and the control circuit is further configured to control the energy recovery drive circuit to enable the junction capacitor of the switch circuit to charge the energy storage capacitor in the energy recovery drive circuit at the third moment, and enable the junction capacitor of the switch circuit to discharge to the ground through the energy recovery drive circuit at the fourth moment comprises:

the control circuit is configured to control the energy recovery circuit to enable the junction capacitor of the switch circuit to charge the energy storage capacitor in the energy recovery circuit at the third moment, and control the push-pull drive circuit to enable the junction capacitor of the switch circuit to discharge to the ground through the push-pull drive circuit at the fourth moment, wherein the switch circuit comprises:

a resistor R4;

a MOS transistor M0;

a capacitor Cdg; and a capacitor Cgs, wherein a first terminal of the resistor R4 is operatively coupled to a gate of the MOS transistor M0, two terminals of the capacitor Cdg are respectively operatively coupled to a drain and the gate of the MOS transistor M0, two terminals of the capacitor Cgs are respectively operatively coupled to a source and the gate of the MOS transistor, and the source of the MOS transistor M0 is operatively coupled to a second terminal of the resistor R4, the switch circuit is switched on includes the drain and the source of the MOS transistor M0 are connected, the switch circuit is switched off includes the drain and the source of the MOS transistor M0 are disconnected, and the junction capacitor of the switch circuit comprises the capacitor Cdg and the capacitor Cgs.

* * * * *